United States Patent
Tsuchi

(10) Patent No.: US 12,254,813 B2
(45) Date of Patent: Mar. 18, 2025

(54) OUTPUT BUFFER CIRCUIT, DATA DRIVER, DISPLAY DEVICE, AND SEMICONDUCTOR DEVICE

(71) Applicant: LAPIS Technology Co., Ltd., Yokohama (JP)

(72) Inventor: Hiroshi Tsuchi, Yokohama (JP)

(73) Assignee: LAPIS Technology Co., Ltd., Yokohama (JP)

( * ) Notice: Subject to any disclaimer, the term of this patent is extended or adjusted under 35 U.S.C. 154(b) by 0 days.

(21) Appl. No.: 18/604,531

(22) Filed: Mar. 14, 2024

(65) Prior Publication Data
US 2024/0321169 A1    Sep. 26, 2024

(30) Foreign Application Priority Data
Mar. 20, 2023 (JP) ................. 2023-044390

(51) Int. Cl.
  *G09G 3/20* (2006.01)
  *H03K 19/003* (2006.01)

(52) U.S. Cl.
  CPC ..... *G09G 3/2092* (2013.01); *H03K 19/00361* (2013.01); *G09G 2300/0426* (2013.01); *G09G 2310/0291* (2013.01); *G09G 2310/08* (2013.01); *G09G 2330/021* (2013.01); *G09G 2330/06* (2013.01)

(58) Field of Classification Search
None
See application file for complete search history.

(56) References Cited

U.S. PATENT DOCUMENTS

2019/0147825 A1* 5/2019 Tsuchi ............... H03F 3/4521
                                                    345/209

FOREIGN PATENT DOCUMENTS

JP        H06152374        5/1994

* cited by examiner

*Primary Examiner* — Christopher J Kohlman
(74) *Attorney, Agent, or Firm* — JCIPRNET

(57) ABSTRACT

The disclosure includes: a first transistor, supplying a first power voltage to the output terminal when becoming ON according to a voltage of the input signal received by a gate; a second transistor, supplying a second power voltage to the output terminal in a case of becoming ON in accordance with the voltage of the input signal received by a gate; and an output control part, transitioning to ON by changing a voltage of the gate of the transistor in OFF between the first and second transistors at a change speed based on a current value of a bias current generated by a bias part when the voltage of the input signal changes. According to a voltage change of the input signal, the bias part sets a bias current value to a first value throughout a predetermined period, and switches to a second, lower value in other periods.

13 Claims, 10 Drawing Sheets

OUTPUT BUFFER CIRCUIT, DATA DRIVER, DISPLAY DEVICE, AND SEMICONDUCTOR DEVICE

CROSS-REFERENCE TO RELATED APPLICATION

This application claims priority under 35 USC 119 from Japanese Patent application No. 2023-044390 filed on Mar. 20, 2023, the disclosure of which is incorporated by reference herein.

BACKGROUND

Technical Field

The disclosure relates to an output buffer circuit that drives a load, a data driver including the output buffer circuit, and a display device.

Description of Related Art

In a semiconductor integrated device that drives a load connected externally, an output buffer that outputs a drive signal for driving the load is provided. The output buffer includes, for example, a P-channel metal oxide semiconductor (MOS) type transistor and an N-channel MOS type transistor in which a binary (logic level 0, 1) input signal is received by the respective gate ends and respective drain ends are connected with the output node. With such configuration, the output buffer outputs a binary drive signal from the output node by setting the two transistors to the ON state in a complementary manner by the binary input signal.

Meanwhile, as the load serving as a drive target, there is a scan driver (referred to as a gate in panel (GIP) in the following) formed by using a thin film transistor on an insulating substrate, such as glass or plastics, of a liquid display panel or an organic EL display panel. In addition, in a small or medium panel, there is a selection circuit (referred to as a multiplexer in the following) formed by using a thin film transistor for outputting, in a time division manner, a gradation signal from one driver output toward multiple data lines on the panel. The GIP and the multiplexer have a relatively large capacity, such as a parasitic capacity of a drive element of a thin film transistor circuit or a wiring capacity of a wiring length responsive to the panel size. In the semiconductor integrated device that drives the GIP and the multiplexer, high-voltage pulse drive that performs ON/OFF control of the thin film transistor on the panel is required. Therefore, a high-drive output buffer is used as the output buffer.

In such high-drive output buffer, by delaying the timing of switching one of the two transistors from the ON state to the OFF state with respect to the timing of switching the other transistor from the OFF state to the ON state, the case where both of the transistors are in the ON state at the same time occurs temporarily. Accordingly, a relatively large through current flows between the two transistors, and, due to the through current, electromagnetic interference (EMI) may occur and power consumption may increase. In addition, EMI that occurs due to current fluctuation that comes along with a charge/discharge current at the time of load drive may occur.

Therefore, in order to solve such issue, an output buffer circuit is proposed (see Japanese Patent No. H06-152374, for example). In the output buffer circuit, a pre-buffer part is provided at a stage prior to the buffer part including the P-channel MOS type transistor and the N-channel MOS type transistor.

The pre-buffer part included in the output buffer circuit disclosed in Japanese Patent No. H06-152374 has a first inverter and a second inverter. The first inverter receives the input signal and supplies an inverted signal of the input signal to the gate of the P-channel MOS transistor. The second inverter receives the input signal and supplies an inverted signal of the input signal to the gate of the N-channel MOS transistor. At this time, a current source is connected with the source of the N-channel MOS transistor of the first inverter and a current source is connected with the source of the P-channel MOS transistor of the second inverter. In the output buffer circuit disclosed in Japanese Patent No. H06-152374, by individually adjusting the current flowing at each current source of the pre-buffer part, the transition from the ON state to the OFF state of the two transistors of the buffer part can be made faster than the transition from the OFF state to the ON state. Accordingly, in the output buffer circuit, the state in which the two transistors of the buffer part are in the ON state at the same time is avoided, the through current is avoided, and the voltage change of the output signal is delayed.

Meanwhile, in the output buffer circuit disclosed in Japanese Patent No. H06-152374, as the current flowing through the current source of the pre-buffer part decreases, the time during which the two transistors of the buffer part is transitioned from OFF to ON increases. Accordingly, the voltage change of the output signal becomes gradual, and the through current is suppressed. Therefore, EMI can be reduced. However, the current drive capability of the output buffer circuit decreases correspondingly, and the pulse voltage waveform of the output signal becomes more blunt. Thus, high-speed load drive becomes impossible.

In this way, the decrease of EMI and the current drive capability exhibit a trade-off relationship, and the optimal adjustment value differs as the load that serves as the drive target differs. Therefore, an output buffer circuit in which an adjustment circuit for adjusting current drive capability is built is desired.

Thus, in the case where the load drive capability of a multi-output output buffer circuit is adjusted by using current value, it is considered to adopt a current mirror configuration including an input-side current path and multiple output-side current paths. A current corresponding to the load drive capability as a target flows through the input-side current path. The output-side current paths respectively output, as mirrors, the current flowing through the input-side current path.

Thus, the area of the multi-output output buffer circuit can be reduced. However, as the output number increases, the current flowing through the input side of the current mirror needs to increase. As a result, the current consumption on the input side increases and, as a consequence, the power consumption of the output buffer circuit itself increases. Although the power consumption can be suppressed by increasing the mirror ratio of the output-side current to the input-side current, the size of the transistor on the output side needs to increase in order to increase the mirror ratio. As a result, the circuit area of the output buffer circuit increases.

Therefore, the disclosure provides an output buffer circuit, a data driver, and a display device capable of reducing power consumption and circuit area.

SUMMARY

An output buffer circuit according to an aspect of the disclosure is an output buffer circuit for outputting an output signal in which a binary input signal is amplified from an output terminal. The output buffer circuit includes: a bias part, generating a bias current; and a buffer part, generating a mirror current of the bias current, receiving the input terminal, and generating the output signal, The buffer part includes: a first transistor of a first conductivity type, supplying a first power voltage to the output terminal in a case of becoming an ON state in accordance with a voltage of the input signal received by a gate of the first transistor; a second transistor of a second conductivity type, supplying a second power voltage to the output terminal in a case of becoming the ON state in accordance with the voltage of the input signal received by a gate of the second transistor; and an output control part, transitioning a transistor in an OFF state between the first transistor and the second transistor to the ON state by changing a voltage of the gate of the transistor in the OFF state at a change speed based on a current value of the mirror current when the voltage of the input signal changes. In accordance with a voltage change of the input signal, the bias part sets a current value of the bias current to a first current value throughout a predetermined period, and switches the current value of the bias current to a second current value smaller than the first current value in periods other than the predetermined period.

An output buffer circuit according to another aspect of the disclosure is an output buffer circuit for outputting $1^{st}$ to $M^{th}$ output signals in which binary $1^{st}$ to $M^{th}$ input signals are respectively amplified from $1^{st}$ to $M^{th}$ output terminals, M being an integer equal to or greater than 2. The output buffer circuit includes: a bias part, generating a bias current; and $1^{st}$ to $M^{th}$ buffer parts, individually receiving the $1^{st}$ to $M^{th}$ input signals, individually generating mirror currents of the bias current, and individually connected with one corresponding output terminal of the $1^{st}$ to $M^{th}$ output signals. Each of the $1^{st}$ to $M^{th}$ buffer parts has: a first transistor of a first conductivity type, receiving the input signal received by its own by using a gate, and supplying a first power voltage to the one output terminal in a case of becoming an ON state in accordance with a voltage of the input signal; a second transistor of a second conductivity type, receiving the input signal received by its own by using a gate, and supplying a second power voltage lower than the first power voltage to the one output terminal in a case of becoming the ON state in accordance with the voltage of the input signal; and an output control part, transitioning a transistor in an OFF state between the first transistor and the second transistor to the ON state by changing a voltage of the gate of the transistor in the OFF state at a change speed based on a current value of the mirror current when the voltage of the input signal changes. In accordance with a voltage change of each of the $1^{st}$ to $M^{th}$ input signals, the bias part sets a current value of the bias current to a first current value throughout a predetermined period, and switches the current value of the bias current to a second current value smaller than the first current value in periods other than the predetermined period.

A data driver according to an aspect of the disclosure is a data driver driving, in accordance with a video data signal, a display panel. The display panel is disposed with: $1^{st}$ to $m^{th}$ data lines, m being an integer equal to or more than 2, and multiple gate lines, the $1^{st}$ to $m^{th}$ data lines stretching along a horizontal direction of a display frame, and the gate lines stretching along a vertical direction of the display frame; a scan driver, receiving a gate timing signal and supplying a gate selection signal at a timing in accordance with the gate timing signal to each of the gate lines; and (m/j) multiplexers, provided for every j of the $1^{st}$ to $m^{th}$ data lines, j being an integer equal to or greater than 2, each of the multiplexers having one input end, and the (m/j) multiplexers selectively and sequentially connecting each of the j data lines to the input end in accordance with a data line selection signal. The data driver includes: a gradation voltage output part, generating (m/j) gradation voltage signals having voltage values corresponding to brightness levels of respective pixels based on the video data signal, and supplying the respective (m/j) gradation voltage signals to the input ends of the respective (m/j) multiplexers; and the output buffer circuit. The data driver supplies the gate timing signal or the data line selection signal, as the output signal of the output buffer circuit, to the display panel.

A display device, having a display panel and a data driver. The display panel is disposed with: $1^{st}$ to $m^{th}$ data lines, m being an integer equal to or more than 2, and multiple gate lines, the $1^{st}$ to $m^{th}$ data lines stretching along a horizontal direction of a display frame, and the gate lines stretching along a vertical direction of the display frame; a scan driver, receiving a gate timing signal and supplying a gate selection signal at a timing in accordance with the gate timing signal to each of the gate lines; and (m/j) multiplexers, provided for every j of the $1^{st}$ to $m^{th}$ data lines, j being an integer equal to or greater than 2, each of the multiplexers having one input end, and the (m/j) multiplexers selectively and sequentially connecting each of the j data lines to the input end in accordance with a data line selection signal. The data driver receives a video data signal and generates (m/j) gradation voltage signals having voltage values corresponding to brightness levels of respective pixels based on the video data signal, and supplies the respective (m/j) gradation voltage signals to the input ends of the respective (m/j) multiplexers. The data driver includes the output buffer circuit as claimed in claim 9, and supplies the gate timing signal or the data line selection signal, as the output signal of the output buffer circuit, to the display panel.

A semiconductor device according to an aspect of the disclosure is a semiconductor device that drives a display panel disposed with: multiple data lines and multiple gate lines, the data lines stretching along a horizontal direction of a display frame, and the gate lines stretching along a vertical direction of the display frame; and a thin film transistor, controlling driving of a display frame by using the display device. The semiconductor device includes the output buffer circuit as claimed in claim 9, and supplies the $1^{st}$ to $M^{th}$ output signals of the output buffer circuit to the display panel in accordance with a predetermined driving timing signal.

DESCRIPTION OF THE EMBODIMENTS

The output buffer circuit according to the disclosure generates the output signal having the first or second power voltage by supplying, as the gate voltage, the voltage based on the binary input signal to the respective gates of the first and second transistors of the output stage to make the first or second transistor ON in a complimentary manner. At this time, in the output buffer circuit, when the voltage of the input signal changes, the gate voltage of the transistor in the OFF state between the first and second transistors is changed at a change speed based on the current value of the bias current generated by the bias part. Accordingly, the transistor in the OFF state between the first and second transistors is transitioned to the ON state after the transistor in the ON state between the first and second transistors is transitioned to the OFF state. Accordingly, the first and second transistors are prevented from being ON at the same time, and an instantaneous through current flowing between the two transistors is prevented. Therefore, EMI coming along with the through current is suppressed. In addition, when the output buffer circuit drives a load capacity connected with the output terminal, the increase in EMI is suppressed by decreasing a relatively large peak value and limiting the current change speed of the current caused to flow to the first and second transistors that comes together with the charge/discharge of the load capacity.

In addition, in the output buffer circuit according to the disclosure, in accordance with the voltage change of the input signal, the current value of the bias current is set to the first current value throughout the predetermined period, and the current value of the bias current is switched to the second current value smaller than the first current value in the periods other than the predetermined period. Accordingly, the size of the transistor causing the bias current to flow does not increase, and, in accordance with the voltage change of the input signal, it is possible to gradually change the gate voltage of the transistor of the output stage, which is in the OFF state, at a desired change speed.

Consequently, according to the output buffer circuit of the disclosure, the occurrence of EMI is suppressed, and it is possible to reduce power consumption as well as circuit area.

Figure 1:
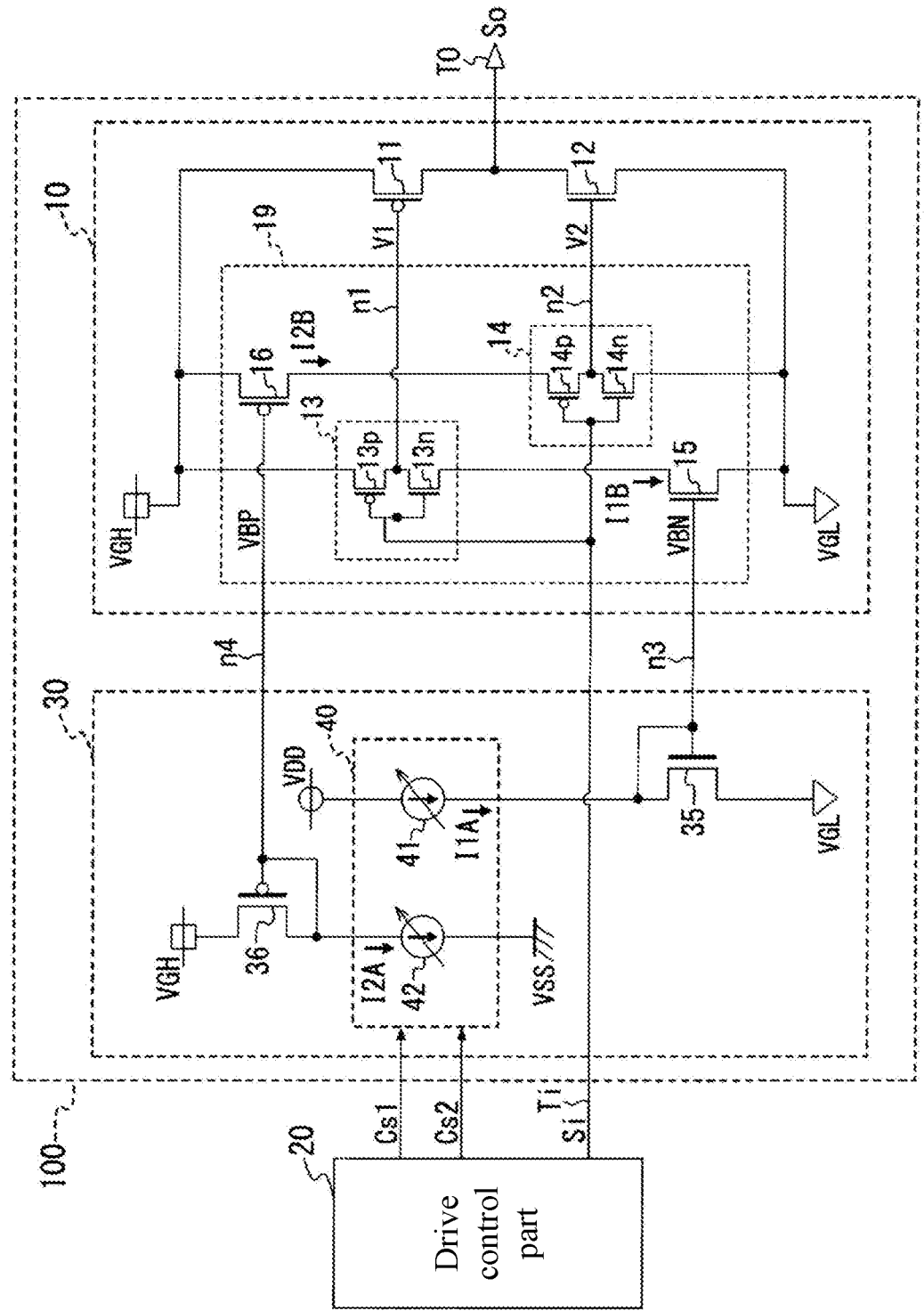
FIG. 1 is a circuit diagram illustrating a configuration of an output buffer circuit 100 as an example of an output buffer circuit according to the disclosure.

FIG. 1 is a circuit diagram illustrating a configuration of an output buffer circuit 100 as an example of an output buffer circuit according to the disclosure.

As shown in FIG. 1, the output buffer circuit 100 includes a buffer part 10 and a bias part 30, and is provided with a drive control part 20 that controls an operation of the output buffer circuit 100.

The buffer part 10 of the output buffer circuit 100 includes an output stage and an output control part 19. The output stage is formed by a P-channel transistor 11 and an N-channel transistor 12. The output control part 19 controls the gate voltage of each of the transistors 11 and 12.

A power voltage VGH is applied to the source of the transistor 11, and a power voltage VGL is applied to the source of the transistor 12. The drain of each of the transistors 11 and 12 is connected with an output terminal TO. The voltage generated at the output terminal TO is output as an output signal So having a binary (logic level 0 or 1) signal level.

The output control part 19 includes inverters 13, 14, an N-channel transistor 15, and a P-channel transistor 16.

The inverter 13 is formed by an N-channel transistor 13n and a P-channel transistor 13p. The respective gates of the transistors 13n and 13p are connected with each other, and a common connection point thereof forms the input end of the inverter 13. The input end is connected with a node Ti and receives an input signal Si having a binary (logic level 0 or 1) signal level via the node Ti. In addition, the respective drains of the transistors 13n and 13p are connected, and a common connection point thereof forms the output end of the inverter 13. The output end is connected to the gate of the transistor 11 via a node n1. The source of the transistor 13p is connected with a positive power terminal and receives the power voltage VGH, and the source of the transistor 13n is connected with a negative power terminal and receives the power voltage VGL via the transistor 15.

With such configuration, the inverter 13 supplies the voltage of a signal in which the phase of the input signal Si received via the node Ti is inverted to the gate of the transistor 11 via the node n1.

The inverter 14 is formed by an N-channel transistor 14n and a P-channel transistor 14p. The respective gates of the transistors 14n and 14p are connected, and a common connection point thereof forms the input end of the inverter 14. The input end is connected with the node Ti, and receives the input signal Si via the node Ti. In addition, the respective drains of the transistors 14n and 14p are connected, and a common connection point thereof forms the output end of the inverter 14. The output end is connected to the gate of the transistor 12 via a node n2. The source of the transistor 14p is connected with a positive power terminal via the transistor 16 and receives the power voltage VGH, and the source of the transistor 14n is connected with a negative power terminal and receives the power voltage VGL.

With such configuration, the inverter 14 supplies the voltage of a signal in which the phase of the input signal Si received via the node Ti is inverted to the gate of the transistor 12 via the node n2.

In the transistor 15, the drain of this own is connected with the source of the transistor 13n, which is the negative power terminal of the inverter 13. In addition, the transistor 15 receives the power voltage VGL by using the source of its own, and receives a bias voltage VBN supplied from the bias part 30 via a node n3 by using the gate.

In the transistor 16, the drain of its own is connected with the source of the transistor 14p, which is the positive power terminal of the inverter 14. In addition, the transistor 16 receives the power voltage VGH by using the source of its own, and receives a bias voltage VBP supplied from the bias part 30 via a node n4 by using the gate.

The drive control part 20 generates a signal group required for the operation of the output buffer circuit 100. The drive control part 20 generates a binary (logic level 0 or 1) input signal in which the voltage (signal level) changes by using the amplitudes of the power voltages VGL to VGH and supplies the binary input signal to the buffer part 10 of the output buffer circuit 100 via the node Ti.

In addition, in accordance with the voltage change of the input signal Si, the drive control part 20 generates a timing control signal Cs1 that indicates the timing of setting the current value of the bias current to a predetermined first current value only during a predetermined period and switches the current value of the bias current to a second current value smaller than the first current value.

Specifically, in accordance with the transition of the input signal Si from the power voltage VGL to VGH, i.e., the so-called voltage rising, the drive control part 20 generates the timing control signal CS1 indicating a period from the time point when such rising starts until a predetermined period Twr has passed. Moreover, in accordance with the transition of the input signal Si from the power voltage VGH to VGL, i.e., the so-called voltage dropping, the drive control part 20 generates the timing control signal CS1 indicating a period from the time point when such dropping starts until a predetermined period Twf has passed.

Moreover, the drive control part 20 generates a setting signal CS2 that sets the current values of the bias current generated in the predetermined periods Twr, Twf, and other periods.

For example, the drive control part 20 generates the setting signal Cs2 that sets the bias current to a current value Ir1 during the predetermined period Twr, sets the bias current to the current value If1 during the predetermined period Twf, and sets the bias current to a current value Ir2 or If2 lower than the current values Ir1 and If1 in periods other than the predetermined periods Twr and Twf.

In addition, the drive control part 20 supplies the timing control signal Cs1 and the setting signal Cs2 generated as in the above to the bias part 30 of the output buffer circuit 100.

Although the above describes an example in which the control of switching the current value of the bias current by respectively using the timing control signal Cs1 and the setting signal Cs2 supplied from the drive control part 20, the control may also be exerted by using a common control signal of the timing control signal and the setting signal. For example, the drive control part 20 may also supply, to the bias part 30, a control signal that sets the bias current to the current value Ir1 during the predetermined period Twr and sets the bias current to a current value lower than the current value Ir1 in periods other than the predetermined period Twr, as well as a control signal that sets the bias current to the current value If1 during the predetermined period Twf and sets the bias current to the current value If2 lower than the current value If1 in periods other than the predetermined period Twf. In the following, an example in which the timing control signal Cs1 and the setting signal Cs2 are supplied from the drive control part 20 is described.

The bias part 30 of the output buffer circuit 100 includes an N-channel transistor 35 and a P-channel transistor 36 as a current voltage conversion part, and a bias modulation part 40.

In the transistor 35, the gate and the drain of its own are connected with the gate of the transistor 15 of the buffer part 10 via the node n3, and the source of its own receives the power voltage VGL. In the transistor 36, the gate and the drain of its own are connected to the gate of the transistor 16 of the buffer part 10 via the node n4, and the power voltage VGH is applied to the source of its own.

The bias modulation part 40 includes variable current sources 41, 42.

The variable current source 41 generates a bias current I1A having a current value based on the timing control signal Cs1 and the setting signal Cs2 supplied from the drive control part 20 and transmits the bias current I1A to the drain of the transistor 35. That is, the variable current source 41 generates the bias current I1A having the current value Ir1 throughout the predetermined period Twr from the time point when the input signal Si rises and having the current value Ir2 lower than the current value Ir1 in other periods, and transmits the bias current I1A to the drain of the transistor 35. At this time, the voltage generated at the node n3 is supplied, as the bias voltage VBN, to the gate of the transistor 15 of the buffer part 10 via the node n3.

The variable current source 41 generates a bias current I2A having a current value based on the timing control signal Cs1 and the setting signal Cs2, and causes the bias current I2A to flow to the transistor 36. That is, the variable current source 42 generates the bias current I2A having the current value If1 throughout the predetermined period Twf from the time point when the input signal Si drops and having the current value If2 lower than the current value If1 in other periods, and causes the bias current I2A to flow to the transistor 36. At this time, the voltage generated by the node n4 is supplied, as the bias voltage VBP, to the gate of the transistor 16 of the buffer part 10 via the node n4.

With such configuration, the bias part 30 generates the bias current (I1A, I2A) having the current value (Ir1, If1) indicated in the setting signal Cs2 in the predetermined period (Twr, Twf) set when the voltage of the input signal Si changes based on the timing control signal Cs1. In addition, the bias part 30 generates the bias current (I1A, I2A) having the current value (Ir2, If2) smaller than the current value (Ir1, If1) as indicated in the setting signal Cs2 during periods other than the predetermined period (Twr, Twf). In addition, the bias part 30 supplies the bias voltage (VBP, VBN) having the voltage value corresponding to the generated bias current (I1A, I2A) to the buffer part 10.

Here, in the configuration shown in FIG. 1, the transistor 35 of the bias part 30 and the transistor 15 of the buffer part 10 form a first current mirror circuit. Accordingly, the bias current I1B mirroring the bias current I1A flowing to the transistor 35 can flow to the transistor 15. In addition, the transistor 36 of the bias part 30 and the transistor 16 of the buffer part 10 form a second current mirror circuit. Accordingly, the bias current I2B mirroring the bias current I2A flowing to the transistor 36 can flow to the transistor 16. The current mirror ratio between the bias currents I1A and I1B can be set in advance according to the channel width size ratio or the ratio of the number of transistors of the same size of the transistor 35 of the bias part 30 and the transistor 15 of the buffer part 10. Likewise, the current mirror ratio between the bias currents I2A and I2B can be set in advance according to the channel width size ratio or the ratio of the number of transistors of the same size of the transistor 36 of the bias part 30 and the transistor 16 of the buffer part 10.

According to the above, the bias currents I1B and I2B are controlled by the bias part 30 based on the timing control signal Cs1 and the setting signal Cs2 supplied from the drive control part 20.

It is noted that the respective voltage values of power voltages VSS, VDD, VGL, and VGH exhibit a magnitude relationship as follows:

$$VGH \geq VDD > VSS \geq VGL$$

In addition, the drive control part 20 generates the binary (logic level 0 or 1) input signal Si having the amplitudes of the power voltages VGL to VGH and the binary (logic level 0 or 1) timing control signal Cs1 and setting signal Cs2 having the amplitudes of the power voltages VSS to VDD, and supplies the input signal Si, the timing control signal Cs1, and the setting signal Cs2 to the bias part 30. It is noted that the drive control part 20 includes a level shifter group that performs conversion to the respective amplitudes of the power voltages VGL to VGH or the power voltages VSS to VDD based on the signal group having the amplitude of the predetermined reference power voltage.

In the following, the internal operation of the output buffer circuit 100 shown in FIG. 1 is described with reference to the time chart shown in FIG. 2.

Figure 2:
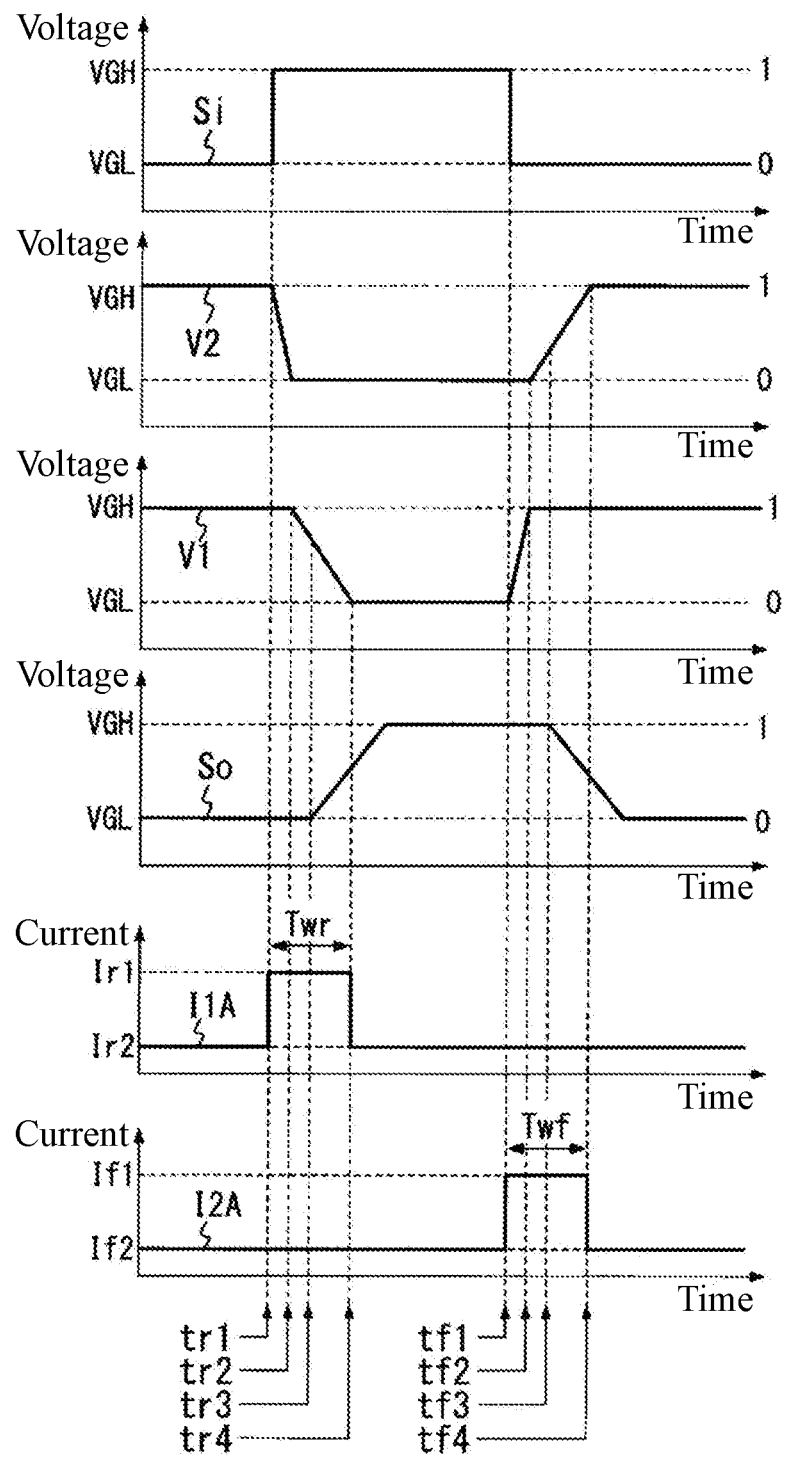
FIG. 2 is a time chart illustrating an example of an internal operation of the output buffer circuit 100.

The time chart shown in FIG. 2 illustrates the waveforms of voltage signals V1, V2, and So at the nodes n1, n2, and the output terminal To generated in the output buffer circuit 100 in the case where the output buffer circuit 100 receives the input signal Si of transitioning from the state of logic level 0 (VGL) to logic level 1 (VGH) at a time point tr1 and transitioning to the state of logic level 0 at a subsequent time point tf1. In addition, the current waveforms of the bias current I1A generated by the variable current source 41 and the bias current I2A generated by the variable current source 42 of the bias modulation part 40 based on the timing control signal Cs1 and the setting signal Cs2 in accordance with the voltage change of the input signal Si are also shown.

The output control part 19 of the output buffer circuit 100 receives the input signal Si, and then supplies, to the inverters 13 and 14 of the buffer part 10, the input signal Si of raising the signal level (voltage) from the state of logic level 0 (VGL) to the state of logic level 1 (VGH) at the time point tr1 and dropping the signal level to the state of logic level 0 (VGL) at the time point tf1, as shown in FIG. 2.

Firstly, when the input signal Si is in the state of logic level 0 (VGL), the inverters 13 and 14 both supply, to the nodes n1, n2, the signals of logic level 1 (VGH) that invert the phase of the input signal Si, respectively. Accordingly, the voltage V1 of the node n1 and the voltage V2 of the node n2 both become the power voltage VGH, the transistor 11 becomes OFF, and the transistor 12 becomes ON. Therefore, the output signal So of logic level 0 (VGL) is output from the output terminal TO, as shown in FIG. 2.

Then, at the time point tr1 shown in FIG. 2, the voltage of the input signal Si rises from the state of logic level 0 (VGL) to logic level 1 (VGH). Accordingly, the transistor 14n of the inverter 14 becomes ON, and the power voltage VGL is supplied to the node n2. Accordingly, as shown in FIG. 2, the voltage V2 of the node n2 transitions to the power voltage VGL, and the transistor 12 becomes OFF. At this time, the voltage V2 of the node n2 changes at a speed substantially following the change speed of the input signal Si, and the transistor 12 quickly changes from ON to OFF.

Moreover, during this time, with the transistor 13n of the inverter 13 becoming ON, the power voltage VGL is supplied to the node n1 via the transistor 15. Meanwhile, when the voltage of the input signal Si rises, the variable current source 41 of the bias part 30 causes the bias current I1A having the current value Ir1 to flow to the transistor 35 throughout the predetermined period Twr from the start time point (tr1) that such voltage starts to rise, as shown in FIG. 2. Accordingly, the transistor 15 of the buffer part 10 can cause a current mirroring the bias current I1A to flow as the bias current I1B.

Accordingly, from a time point tr2 shown in FIG. 2, the voltage V1 of the node n1 decreases at a change speed in accordance with the current value of the bias current I1B (a value obtained by integrating the mirror ratio with the current value Ir1).

In addition, at a time point tr3 when the voltage between the gate and the source of the transistor 11 based on the voltage V1 exceeds a threshold voltage, the transistor 11 becomes ON, and the power voltage VGH is supplied to the output terminal TO. As a result, the voltage V1 of the node n1 reaches the power voltage VGL at a time point tr4 shown in FIG. 2, and the voltage of the output signal So gradually rises at a change speed in accordance with the current value of the bias current I1B to transition to the state of logic level 1 (VGH). Then, when the voltage V1 reaches the power voltage VGL, the current value of the bias current I1B becomes zero. The current value of the bias current I1A flowing to the transistor 35 is switched to the current value Ir2 lower than the current value Ir1 before and after the predetermined period Twr shown in FIG. 2, thereby reducing power consumption. At this time, it is possible to set the current value Ir2 of the bias current I1A to zero. If a delay that comes together with the switching of the current value (from Ir2 to Ir1) at the start time point (tr1) when the voltage of the input signal Si starts to rise is considered, the start time point of the period Twr of switching of the current value may also be set to be slightly earlier than the start point (tr1) when the voltage of the input signal Si starts to rise.

Then, as shown in FIG. 2, at the time point tf1, the input signal Si drops from the state of logic level 1 (VGH) to logic level 0 (VGL). Accordingly, the transistor 13p of the inverter 13 becomes ON, and the power voltage VGH is supplied to the node n1. Accordingly, the voltage V1 of the node n1 transitions to the power voltage VGH, and the transistor 11 becomes OFF. At this time, the voltage V1 of the node n1 changes at a speed substantially following the change speed of the input signal Si, and the transistor 11 quickly changes from ON to OFF.

Moreover, during this time, with the transistor 14p of the inverter 14 becoming ON, the power voltage VGH is supplied to the node n2 via the transistor 16. Meanwhile, when the voltage of the input signal Si drops, the variable current source 42 of the bias part 30 causes the bias current I2A having the current value If1 to flow to the transistor 36 throughout the predetermined period Twf from the start time point (tf1) that such voltage starts to drop, as shown in FIG. 2. Accordingly, the transistor 16 of the buffer part 10 can cause a current mirroring the bias current I2A to flow as the bias current I2B.

Accordingly, from a time point tf2 shown in FIG. 2, the voltage V2 of the node n2 decreases at a change speed in accordance with the current value of the bias current I2B (a value obtained by integrating the mirror ratio with the current value If1).

In addition, at a time point tf3 when the voltage between the gate and the source of the transistor 12 based on the voltage V2 exceeds a threshold voltage, the transistor 12 becomes ON, and the power voltage VGL is supplied to the output terminal TO. As a result, the voltage V2 of the node n2 reaches the power voltage VGH at a time point tf4 shown in FIG. 2, and the voltage of the output signal So gradually drops at a change speed in accordance with the current value of the bias current I2B to transition to the state of logic level 0 (VGL). Then, when the voltage V2 reaches the power voltage VGH, the current value of the bias current I2B becomes zero.

The current value of the bias current I2A flowing to the transistor 36 is switched to the current value If2 lower than the current value If1 before and after the predetermined period Twf shown in FIG. 2, thereby reducing power consumption. At this time, it is possible to set the current value If2 of the bias current I2A to zero. If a delay that comes together with the switching of the current value (from If2 to If1) at the start time point (tf1) when the voltage of the input signal Si starts to drop is considered, the start time point of the period Twf of switching the current value may also be set to be slightly earlier than the start point (tf1) when the voltage of the input signal Si starts to drop.

In this way, in the output buffer circuit 100, the output control part 19 of the buffer part 10 controls the gate voltage of each of the transistors 11 and 12 at the output stage based on the input signal Si. Thus, the transistors 11 and 12 are set in the ON or OFF state in a complementary manner. At this time, the output control part 19 including the inverters 13 and 14 and the transistors 15 and 16 controls the transistors 11 and 12 at the output stage as follows when the voltage of the input signal Si changes.

That is, the output control part 19 causes the gate voltage of the transistor in the ON state between the transistors 11 and 12 to follow the voltage change of the input signal and change, thereby quickly transitioning the transistor to the OFF state.

Meanwhile, regarding the gate voltage of the transistor in the OFF state between the transistors 11 and 12, by controlling the current values of the bias currents I1B and I2B flowing to the transistors 15 and 16, the output control part 19 gradually changes the gate voltage with respect to the voltage change of the input signal. Accordingly, the transistor in the OFF state between the transistors 11 and 12 becomes ON after the transistor in the ON state becomes OFF. Accordingly, it is possible to prevent the transistors 11 and 12 of the output stage from becoming ON at the same time when the voltage of the input signal changes. As a result, an instantaneous through current flowing between the transistors 11 and 12 is prevented, and the occurrence of EMI and the increase in power consumption that come along with the through current are suppressed.

In addition, as shown in FIG. 2, according to the output buffer circuit 100, the change of the voltage of the output signal So is controlled to be gradual, so the change speed of the charge/discharge current at the time of load driving is suppressed, and EMI can be reduced.

Moreover, in the output buffer circuit 100, the current value of the bias current I1A flowing to the input side of the first current mirror circuit (15, 35) generating the bias current I1B is controlled by the variable current source 41 as shown in FIG. 2. In addition, the current value of the bias current I2A flowing to the input side of the second current mirror circuit (16, 36) generating the bias current I2B is controlled by the variable current source 42 as shown in FIG. 2.

That is, the variable current source 41 causes the bias current I1A, which has the current value Ir1 capable of gradually lowering the gate voltage (V1) of the transistor 11 at a desired change speed, to flow to the input side of the first current mirror circuit (15, 35) only during the predetermined period Twr from the start time point (tr1) of rising of the input signal Si as shown in FIG. 2. The variable current source 42 causes the bias current I2A, which has the current value If1 capable of gradually raising the gate voltage (V2) of the transistor 12 at a desired change speed, to flow to the input side of the second current mirror circuit (16, 36) only during the predetermined period Twf from the start time point (tf1) of lowering of the input signal Si as shown in FIG. 2. At this time, the variable current source 41 (42), as shown in FIG. 2, lowers the current value of the bias current I1A (I2A) to the current value Ir2 (If2) smaller than the current value Ir1 (If1) during periods other than the predetermined period Twr (Twf).

Accordingly, it is possible to suppress power consumption, as compared to the case where the current value of the current flowing to the input side of the current mirror circuit is fixed to the current value Ir1 (If1).

Thus, according to the output buffer circuit 100 shown in FIG. 1, it is possible to suppress EMI to realize high-speed drive and low power consumption.

In addition, by connecting multiple buffer parts 10 to the nodes n3 and n4 of a single bias part 30, it is possible to realize multiple outputs and save the area for the output buffer circuit 100 sharing the bias part 30. In this case, the setting of the predetermined periods Twr and Twf in which the current values of the bias currents I1A and I2A are changed is made in accordance with the rising start time point and the dropping start time point of the input signals respectively supplied to the buffer parts 10.

In addition, by adjusting the channel width sizes or the number of transistors of the same size in the transistors 15 and 16 of the respective buffer parts 10, the current mirror ratios of the bias currents I1B, I2B can be set individually. Accordingly, the drive capability of the output signal of each of the buffer parts 10 can be changed in accordance with the load that is driven. However, since the bias part 30 is common, the settings of the current values of the bias currents I1A, I2A are associated therewith.

In an example shown in FIG. 2, the predetermined period Twr is set, so as to include the entire period in which the transistor 11 is transitioned from OFF to ON, which is from the start time point tr2 of voltage dropping of the gate voltage (V1) of the transistor 11 to the time point tr4 of reaching the power voltage VGL. Nevertheless, the predetermined period Twr may be set to include the period of at least a portion within the change period (tr2 to tr4) of the gate voltage (V1) of the transistor 11.

In addition, in an example shown in FIG. 2, the predetermined period Twf is set, so as to include the entire period in which the transistor 12 is transitioned from OFF to ON, which is from the start time point tf2 of voltage rising of the gate voltage (V2) of the transistor 12 to the time point tf4 when the power voltage VGH is reached. However, the predetermined period Twf may be set to include the period of at least a portion within the change period (tf2 to tf4) of the gate voltage (V2) of the transistor 12.

That is, the drive control part 20 may supply to the bias part 30, together with the setting signal (Cs2), the timing signal (Cs1) that sets the period (Twr, Twf) including a portion or the entirety of the change period (tr2 to tr4, tf2 to tf4) in which the gate voltage (V1, V2) of the transistor (11, 12) in the OFF state changes when the voltage of the input signal Si changes.

Embodiment 2

Figure 3:
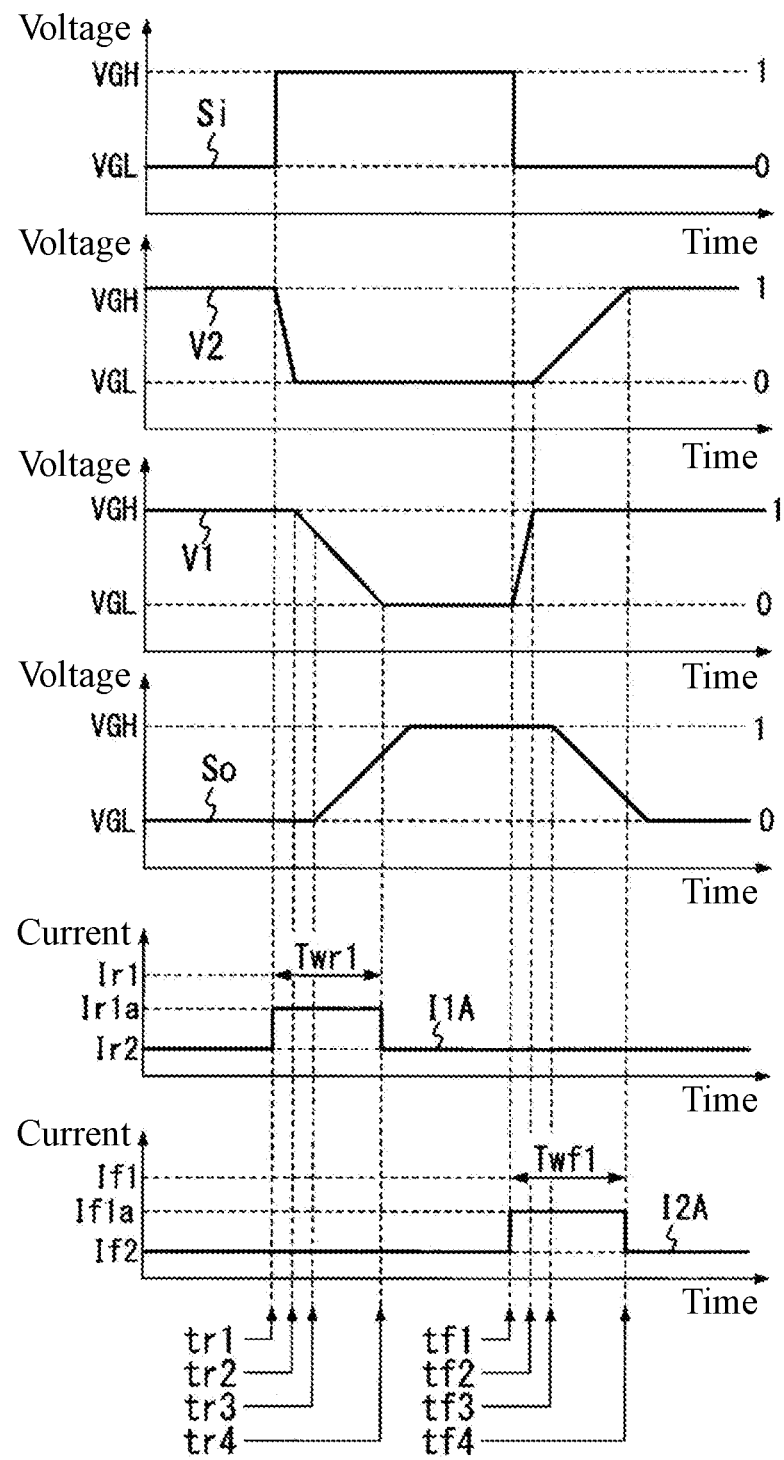
FIG. 3 is a time chart illustrating another example of an internal operation of the output buffer circuit 100.

FIG. 3 is a time chart illustrating another example of an internal operation of the output buffer circuit 100.

In FIG. 3, the current values of the bias currents I1A and I2A caused to flow by the variable current sources 41, 42 are changed to the current values Ir1a and If1a smaller than the current values Ir1 to If1 shown in FIG. 2 based on the setting signal Cs2 when the input signal Si rises and drops, like in FIG. 2.

Accordingly, the current values of the bias currents I1B and I2B flowing into the buffer part 10 decrease, and, correspondingly, as shown in FIG. 3, the speed at which the voltage V1 of the node n1 drops and the speed at which the voltage V2 of the node n2 rises are slower than those shown in FIG. 2.

Therefore, in order for the voltage V1 to reach the target voltage (VGL), the variable current source 41 of the bias part 30 causes the bias current I1A having a current value Ir1a to flow to the input side of the first current mirror circuit (15, 35) throughout a predetermined period Twr1 longer than the predetermined period Twr shown in FIG. 2, as shown in FIG. 3, based on the timing control signal Cs1. Moreover, in order for the voltage V2 to reach the target voltage (VGH), the variable current source 42 causes the bias current I2A having a current value If1*a* to flow to the input side of the second current mirror circuit (16, 36) throughout a predetermined period Twf1 longer than the predetermined period Twf shown in FIG. 2, as shown in FIG. 3, based on the timing control signal Cs1.

In brief, the drive control part 20 generates the timing control signal Cs1 indicating the predetermined periods (Twr, Twr1, Twf, Twf1) to be shorter as the current values (Ir1, Ir1*a*, If1, If1*a*) of the bias currents I1A and I2A set by the setting signal Cs2 increase.

Accordingly, the voltage of the output signal So of the output buffer circuit 100 changes faster and the drive capability increases as the current values of the bias currents I1A and I2A increase. However, the predetermined periods (Twr, Twr1, Twf, Twf1) required for driving may be reduced correspondingly. Therefore, by reducing the predetermined period (Twr, Twr1, Twf, Twf1) in accordance with the drive capability level, the current values of the bias currents I1A and I2A in periods other than the predetermined periods not contributing to the driving of the output buffer circuit 100 are reduced, and the power consumption can be reduced.

Embodiment 3

Figure 4:
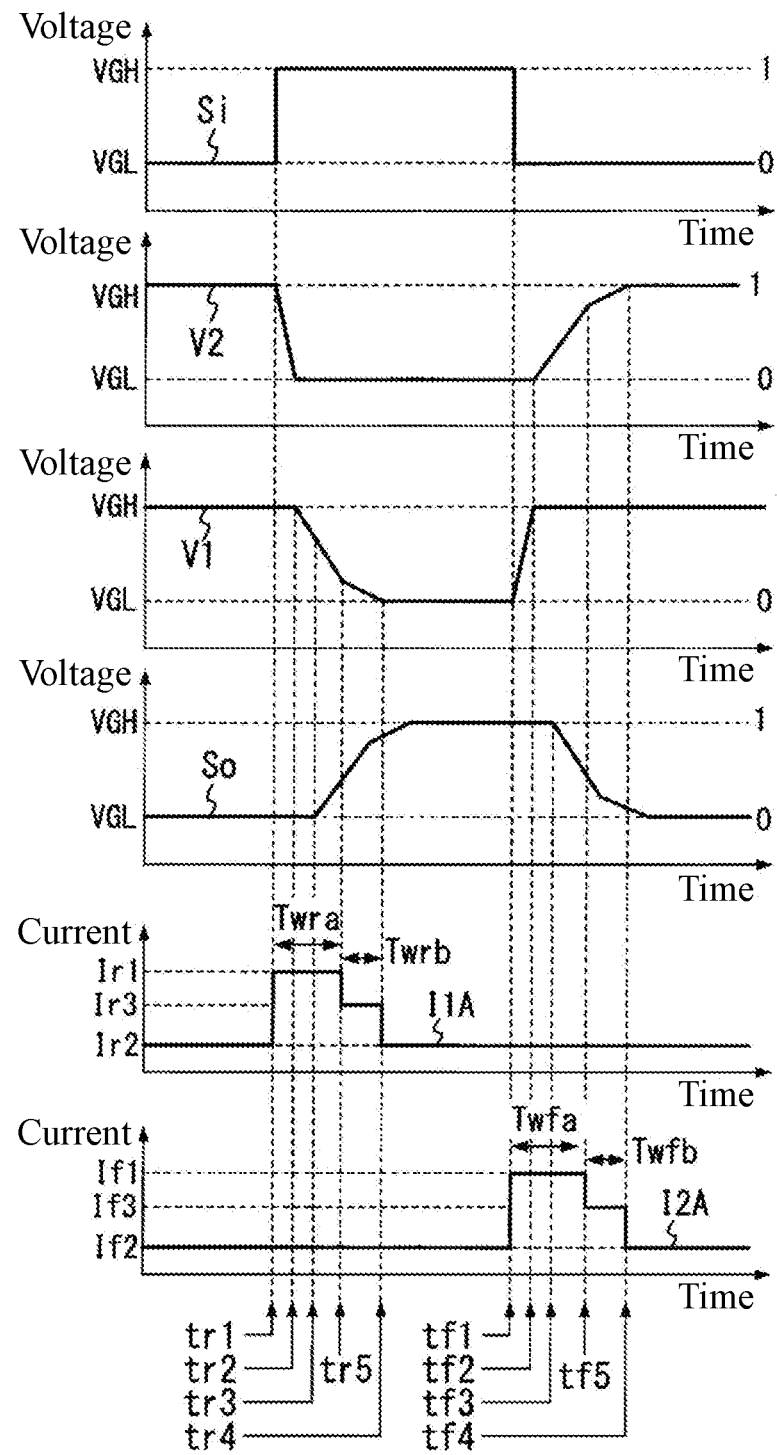
FIG. 4 is a time chart illustrating yet another example of an internal operation of the output buffer circuit 100.

FIG. 4 is a time chart illustrating yet another example of an internal operation of the output buffer circuit 100.

In FIG. 4, the current values of the bias currents I1A and I2A caused to flow by the variable current sources 41, 42 are switched to multiple current values, respectively, when the input signal Si like in FIG. 2 rises and drops.

That is, as shown in FIG. 4, when the voltage V1 drops, the variable current source 41 causes the bias current I1A having the current value Ir1 to flow to the input side of the first current mirror circuit (15, 35) throughout a period Twra from the time point tr1 to a time point tr5 after the time point tr3 has passed. In addition, throughout a period Twrb from the time point tr5 to the time point tr4, the drive control part 20 and the variable current source 41 cause the bias current I1A having a current value Ir3 less than the current value Ir1 and higher than the current value Ir2 to flow to the input side of the first current mirror circuit (15, 35).

In addition, as shown in FIG. 4, when the voltage V2 rises, the variable current source 42 causes the bias current I2A having the current value If1 to flow to the input side of the second current mirror circuit (16, 36) through a period Twfa from the time point tf1 to a time point tf5 after the time point tf3 has passed. In addition, throughout a period Twfb from the time point tf5 to the time point tf4, the drive control part 20 and the variable current source 42 cause the bias current I2A having a current value If3 less than the current value If1 and higher than the current value If2 to flow to the input side of the second current mirror circuit (16, 36).

By switching the respective current values of the bias currents I1A and I2A during the time when the input signal Si rises and drops, as shown in FIG. 4, the change speeds of the respective voltages of the voltages V1, V2 and the output signal So also change.

Embodiment 4

Figure 5A:
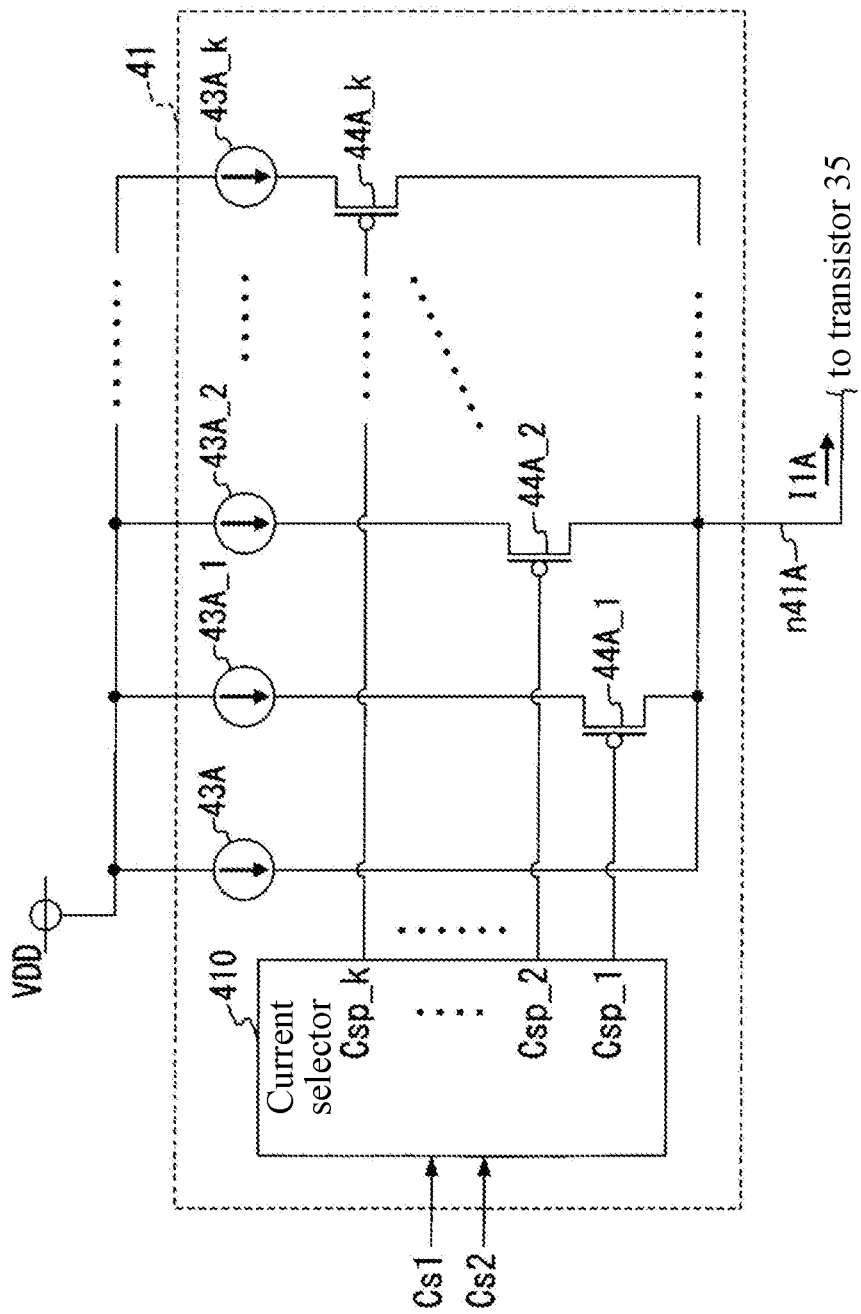
FIG. 5A is a circuit diagram illustrating an example of an internal configuration of a variable current source 41.

FIG. 5A is a circuit diagram illustrating the configuration of the variable current source 41 shown in FIG. 1.

The variable current source 41 includes constant current sources 43A, 43A_1 to 43A_k (k being an integer equal to 2 or more), P-channel MOS transistors 44A_1 to 44A_k respectively serving as switching elements, and a current selector 410.

The constant current sources 43A, 43A_1 to 43A_k are connected in parallel between the power terminal to which the power voltage VDD is applied and a node n41A connected with the drain of the transistor 35 shown in FIG. 1, for example. The transistors 44A_1 to 44A_k are provided in correspondence with the constant current sources 43A_1 to 43A_k. The drain of each of the transistors 44A_1 to 44A_k is connected with the constant current source corresponding to the transistor. The respectively sources are commonly connected with the node n41A.

Based on the timing control signal Cs1 and the setting signal Cs2, the current selector 410 generates control voltages Csp_1 to Csp_k individually setting the transistors 44A_1 to 44A_k to be ON or OFF and respectively supplies the control voltages Csp_1 to Csp_k to the transistors 44A_1 to 44A_k.

With the configuration shown in FIG. 5A, a total current of the currents respectively transmitted from the constant current source connected with the transistor set to be ON among the transistors 44A_1 to 44A_k and the constant current source 43A serves as the bias current I1A.

In the case where the timing control signal Cs1, the setting signal Cs2, and the circuit of the variable current source 41 shown in FIG. 5A are set in the range of the power voltages VSS to VDD, a clamp element may also be provided between the drain of the transistor 35 and the node n41A. For example, by connecting a P-channel transistor operable at the power voltages VGL to VGH and serving as a clamp element between the drain of the transistor 35 and the node n41A and supplying the power voltage VSS or a voltage close to VSS to the gate thereof, the voltage of the node n41A can be secured to be equal to or more than the power voltage VSS.

Figure 5B:
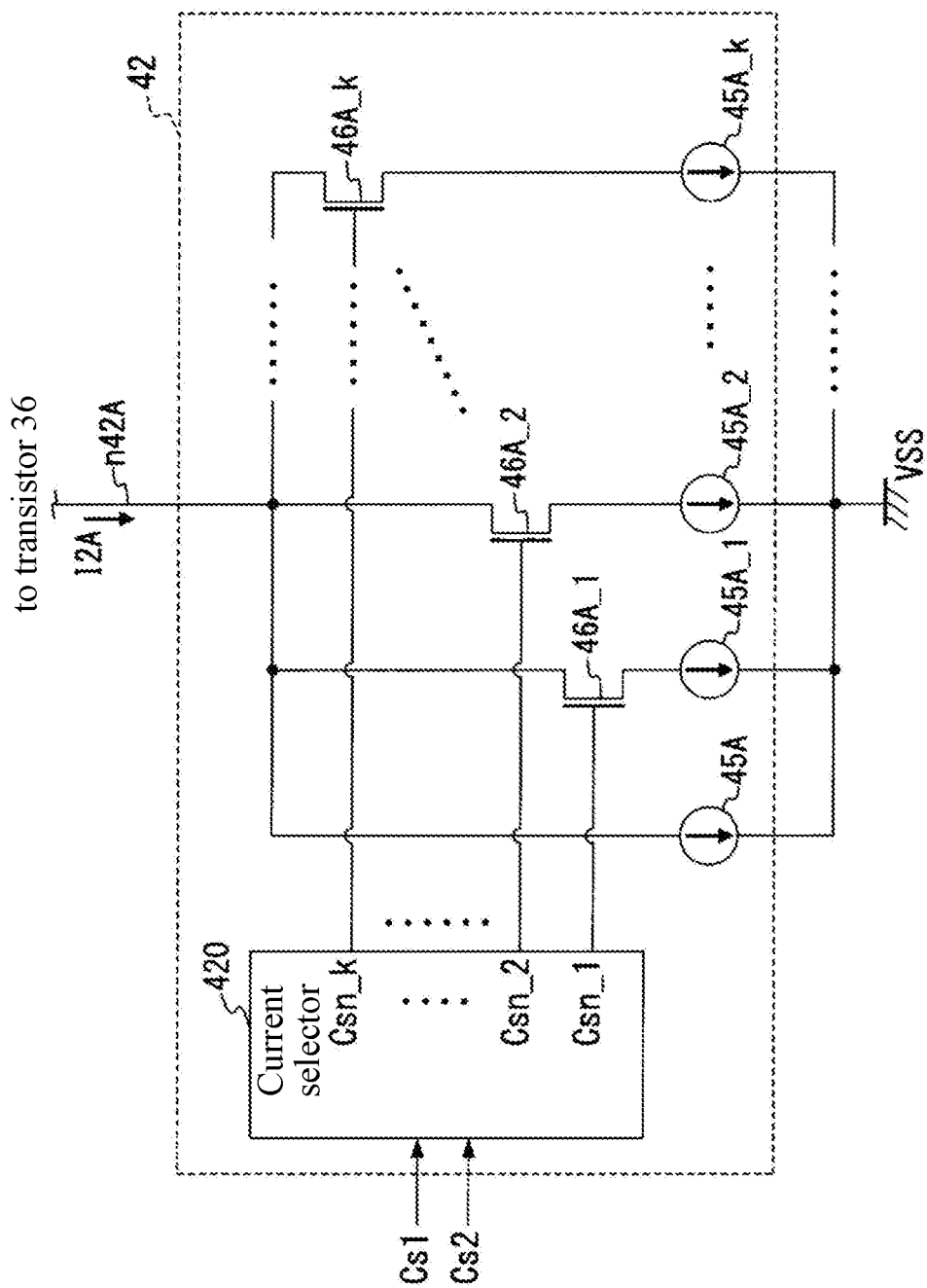
FIG. 5B is a circuit diagram illustrating an example of an internal configuration of a variable current source 42.

FIG. 5B is a circuit diagram illustrating the configuration of the variable current source 42 shown in FIG. 1.

The variable current source 42 includes constant current sources 45A, 45A_1 to 45A_k (k being an integer equal to 2 or more), N-channel MOS transistors 46A_1 to 46A_k respectively serving as switching elements, and a current selector 420.

The constant current sources 45A, 45A_1 to 45A_k are connected in parallel between the power terminal to which the power voltage VSS is applied and a node n42A connected with the drain of the transistor 36 shown in FIG. 1, for example. The transistors 46A_1 to 46A_k are provided in correspondence with the constant current sources 45A_1 to 45A_k. The source of each of the transistors 46A_1 to 46A_k is connected with the constant current source corresponding to the transistor, and each drain is commonly connected with the node n42A.

Based on the timing control signal Cs1 and the setting signal Cs2, the current selector 420 generates control voltages Csn_1 to Csn_k individually setting the transistors 46A_1 to 46A_k to be ON or OFF and respectively supplies the control voltages Csn_1 to Csn_k to the transistors 46A_1 to 46A_k.

With the configuration shown in FIG. 5B, a total current of the currents respectively transmitted from the constant current source connected with the transistor set to be ON among the transistors 46A_1 to 46A_k and the constant current source 45A serves as a current I12.

In the case where the timing control signal Cs1, the setting signal Cs2, and the circuit of the variable current source 42 shown in FIG. 5B are set in the range of the power voltages VSS to VDD, a clamp element may also be provided between the drain of the transistor 36 and the node n42A. For example, by connecting an N-channel transistor operable at the power voltages VGL to VGH and serving as a clamp element between the drain of the transistor 36 and the node n42A and supplying the power voltage VDD or a voltage close to VDD to the gate thereof, the voltage of the node n42A can be secured to be equal to or less than the power voltage VDD.

Embodiment 5

Figure 6:
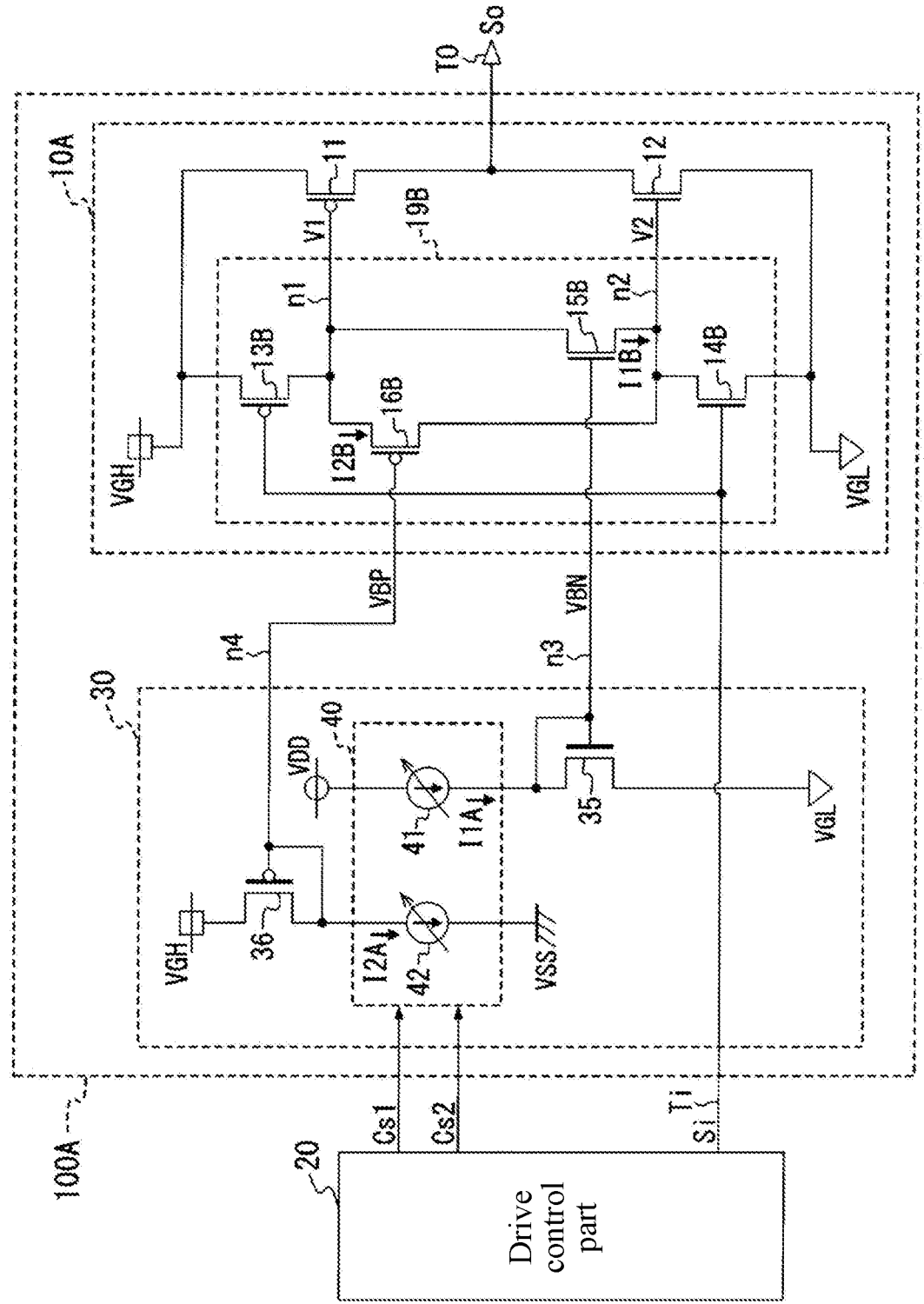
FIG. 6 is a circuit diagram illustrating a configuration of an output buffer circuit 100A as another example of the output buffer circuit.

FIG. 6 is a circuit diagram illustrating a configuration of an output buffer circuit 100A as a modified example of the output buffer circuit 100 shown in FIG. 1. The output buffer circuit 100a includes a buffer part 10A and the bias part 30, and is provided with the drive control part 20 that supplies the input signal Si, the timing control signal Cs1 and the setting signal Cs2.

In the configuration shown in FIG. 6, the buffer part 10A is adopted in place of the buffer part 10 shown in FIG. 1, and the drive control part 20 and the bias part 30 are the same as those shown in FIG. 1.

The buffer part 10A includes an output stage and an output control part 19B. The output stage is formed by the P-channel transistor 11 and the N-channel transistor 12. The output control part 19B controls the gate voltage of each of the transistors 11 and 12.

The power voltage VGH is applied to the source of the transistor 11, and a power voltage VGL is applied to the source of the transistor 12. The drain of each of the transistors 11 and 12 is connected with the output terminal TO. A binary (logic level 0 or 1) signal having the voltage (VGL, VGH) generated at the output terminal TO is output as the output signal So.

The output control part 19B includes P-channel transistors 13B, 16B and N-channel transistors 14B, 15B.

The input signal Si is supplied to the gate of each of the transistors 13B and 14B via the node Ti.

The power voltage VGH is applied to the source of the transistor 13B, and the drain of the transistor 13B is respectively connected with the source of the transistor 16B, the drain of the transistor 15B and the gate of the transistor 11 via the node n1.

The power voltage VGL is applied to the source of the transistor 14B, and the drain of the transistor 14B is respectively connected with the drain of the transistor 16B, the source of the transistor 15B and the gate of the transistor 12 via the node n2.

The bias voltage VBN generated by the bias part 30 is supplied to the gate of the transistor 15B, and the bias voltage VBP generated by the bias part 30 is supplied to the gate of the transistor 16B.

Although the configuration of the output control part 19B is different from the output control part 19 shown in FIG. 1, the effect of controlling the gate voltage of each of the transistors 11 and 12 of the output stage based on the input signal Si, the bias currents I1A and I2A caused to flow by the variable current sources 41 and 42 and the bias currents I1B and I2B that are the mirror currents are the same.

For example, when the input signal Si transitions from the state of logic level 0 to the state of logic level 1, the transistors 13B and 14B respectively become OFF and ON, and the node n2 transitions from the state of the power voltage VGH to the state of the power voltage VGL, thereby quickly transitioning the transistor 12 from ON to OFF. At this time, the transistor 35 of the bias part 30 and the transistor 15B of the buffer part 10A form a pseudo current mirror circuit, and the bias current I1B as the mirror current of the bias current I1A generated by the bias part 30 is generated by the transistor 15B. Accordingly, the gate voltage (V1) of the transistor 11 is lowered at a change speed corresponding to the bias current I1B (the mirror current of I1A). Therefore, the change speed of the voltage of the output signal So is also controlled by the bias current I1A.

In addition, with the same effect when the input signal Si transitions from the state of logic level 1 to the state of logic level 0, the change speed of the voltage of the output signal So is also controlled by the bias current I2A. The current drive capability of the transistors 13B and 14B is set to be greater than the current drive capability of the transistors 15B and 16B.

Here, in the output buffer circuit 100A shown in FIG. 6 as well, like the output buffer circuit 100 shown in FIG. 1, by supplying the gate voltage (V1, V2) based on the binary input signal Si to the gate of each of the transistors 11 and 12 to turn on the transistors 11 and 12 in the complementary manner, the binary output signal So having the power voltage VGH or VGL is output. At this time, in the output buffer circuit 100A as well, like the output buffer circuit 100, when the voltage of the input signal changes, the gate voltage of the transistor in the OFF state between the transistors 11 and 12 is changed gradually at a change speed based on the current value of the bias current generated by the bias part 30. Accordingly, the transistor in the OFF state between the transistors 11 and 12 becomes ON after the transistor in the ON state becomes OFF. Accordingly, the transistors 11 and 12 are prevented from being ON at the same time, and an instantaneous through current flowing between the two transistors is prevented. Therefore, EMI coming along with the through current is suppressed.

In addition, like the output buffer circuit 100, in the output buffer circuit 100A, in accordance with the voltage change of the input signal, the current value of the bias current I1A (I2A) throughout the predetermined period (Twr, Twr1, Twf, Twf1) is set to the first current value Ir1 (If1), and is switched to the second current value Ir2 (If2) smaller than the first current value in periods other than the predetermined period. Accordingly, in accordance with the voltage change of the input signal, it is possible to gradually change the gate voltage of the transistor in the OFF state between the transistors 11 and 12 at the desired change speed based on the current value Ir1 (If1) of the bias current I1A (I2A), and gradually change the voltage of the output signal at the desired change speed in a similar way. In addition, in periods other than the predetermined period (Twr, Twr1, Twf, Twf1) not contributing to the driving of the output buffer circuit 100A, the current value of the bias current I1A (I2A) is reduced, and the power consumption can be reduced.

Accordingly, in the output buffer circuit 100A shown in FIG. 6, like the output buffer circuit 100 shown in FIG. 1, it is possible to suppress the occurrence of EMI and suppress power consumption and circuit area.

The output buffer circuit according to the disclosure is not limited to the circuit configuration shown in FIG. 1 or 6.

In brief, the output buffer circuit according to the disclosure may also have the first and second transistors, the output control part, and the bias part as follows.

The first transistor (11) of the first conductivity type (P-channel) supplies the first power voltage (VGH) to the output terminal (TO) in the case of becoming ON in accordance with the voltage of the input signal (Si) received by the gate of the first transistor.

The second transistor (12) of the second conductivity type (N-channel) supplies the second power voltage (VGL) lower than the first power voltage (VGH) to the output terminal (TO) in the case of becoming ON in accordance with the voltage of the input signal (Si) received by the gate of the second transistor.

When the voltage of the input signal changes, by changing the voltage of the gate of the transistor in the OFF state between the first and second transistors (11, 12) based on the current value of the bias current (I1A, I2A, I1B, I2B), the output control part (19, 19B) transitions the transistor in the OFF state to the ON state.

In accordance with the voltage change of the input signal, the bias part (30) generating the bias current sets the current value of the bias current I1A (12A) to the first current value (Ir1, If1) throughout the predetermined period (Twr, Twr1, Twf, Twf1) and switches the current value of the bias current to the second current value (Ir2, If2) smaller than the first current value (Ir1, If1) during periods other than the predetermined period.

Embodiment 6

Figure 7:
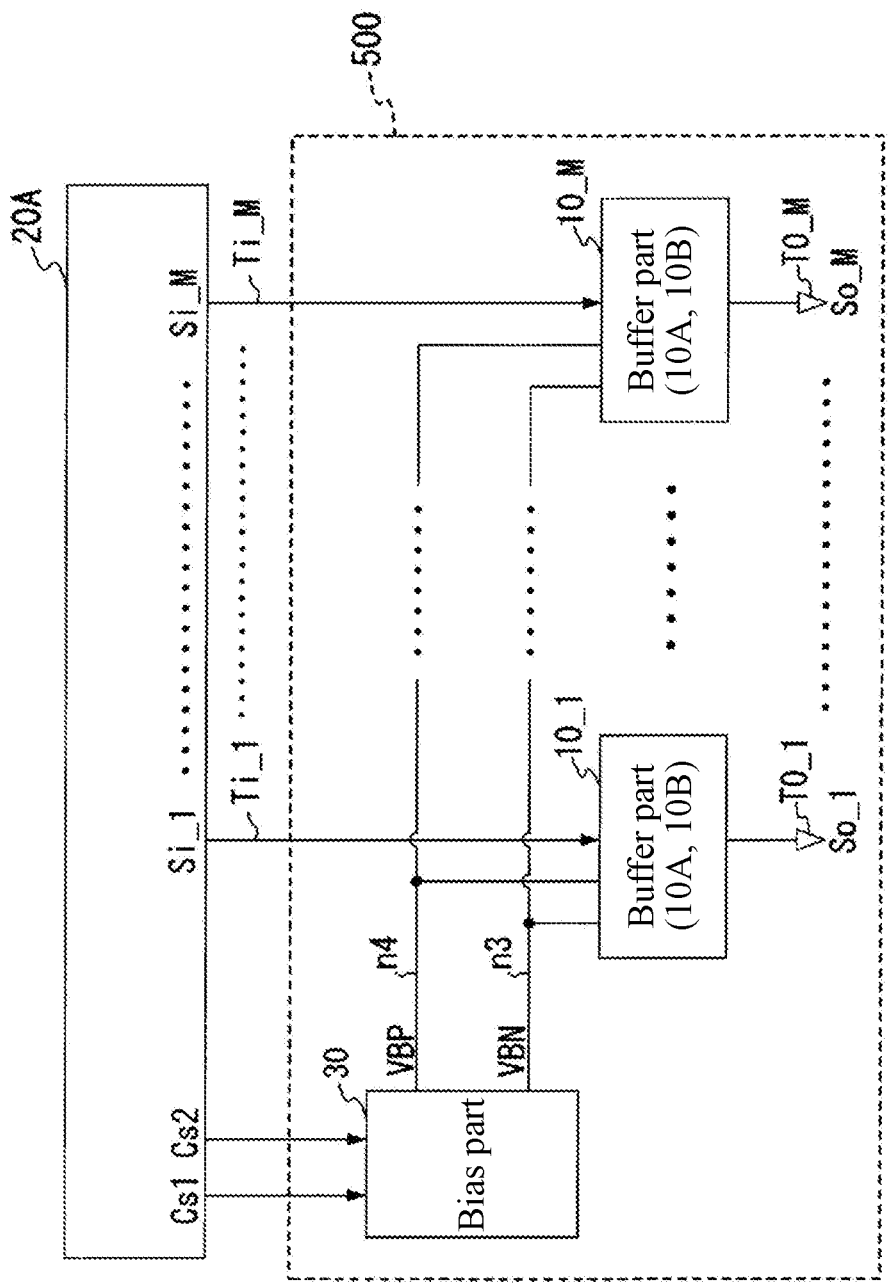
FIG. 7 is a block diagram illustrating a configuration of an output buffer circuit 500 as an example of an output buffer circuit with multiple outputs.

FIG. 7 is a block diagram illustrating a configuration a multi-output buffer circuit 50 with multiple outputs, in which multiple buffer parts 10 (10A) are provided.

As shown in FIG. 7, the output buffer circuit 500 includes the bias part 30 and M (M being an integer of 2 or more) buffer parts 10_1 to 10_M and is provided with a drive control part 20A that controls the operation of the output buffer circuit 500.

Each of the buffer parts 10_1 to 10_M has the same configuration as the buffer part 10 shown in FIG. 1 or the buffer 10A shown in FIG. 6. In addition, the bias part 30 has the same configuration as the bias part 30 shown in FIG. 1 or 6.

The drive control part 20A generates M binary (logic level 0 or 1) input signals Si_1 to Si_M whose voltages (signal levels) respectively vary at the amplitudes of the power voltages VGL to VGH, and supplies the input signals Si_1 to Si_M to the buffer parts 10_1 to 10_M via nodes Ti_1 to Ti_M. In addition, the drive control part 20A, like the drive control part 20, supplies, to the bias part 30, the timing control signal Cs1 and the setting signal Cs2 that are generated.

The bias part 30 supplies the bias voltages VBN and VBP generated based on the timing control signal Cs1 and the setting signal Cs2 as the above to the buffer parts 10_1 to 10_M via the nodes n3 and n4, respectively.

The buffer parts 10_1 to 10_M output, from the output terminals TO_1 to TO_M, the output signals So_1 to So_M in which the input signals Si_1 to Si_M are individually amplified.

In this way, according to the output buffer circuit 500, since it is sufficient to provide the bias part 30 for at least one system with respect to the increase in the output number, it is possible to save the circuit area of the output buffer circuit 500 itself.

Embodiment 7

Figure 8:
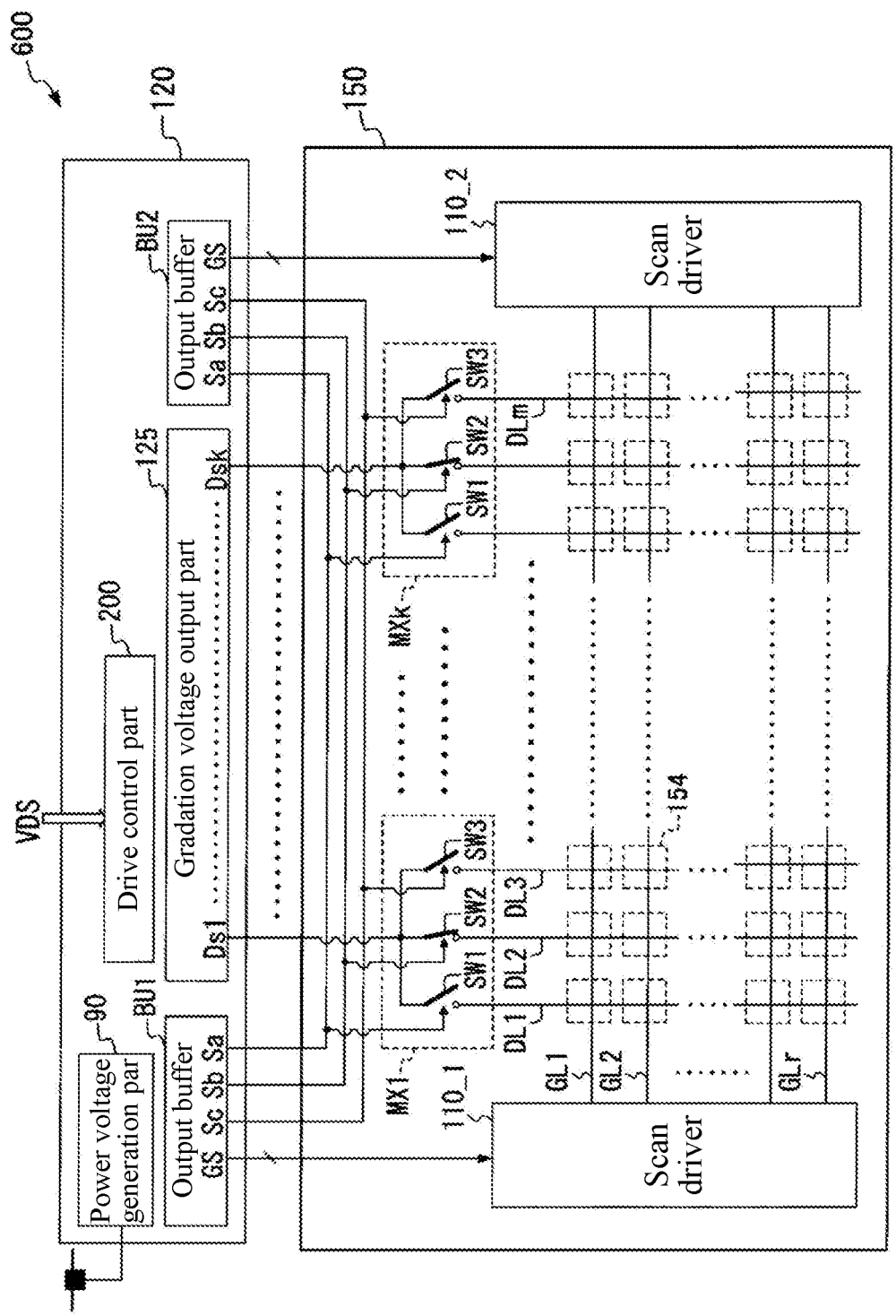
FIG. 8 is a block diagram illustrating a configuration of a display device 600 including the output buffer circuit 500.

FIG. 8 is a block diagram illustrating a schematic configuration of a display device 600 including the output buffer circuit 500 shown in FIG. 7.

The display device 600 includes a data driver 120 and a display panel 150. The display panel 150 has gate lines GL1 to GLr (r being an integer requal to or greater than 2) disposed along the horizontal direction of the display frame and data lines DL1 to DLm (m being an integer equal to or greater than 2) disposed to intersect the respective gate lines. The display device 600 adopts time division manner, in which the data lines DL1 to DLm are grouped into groups of three, for example, and in each of the groups, the three data lines are driven one by one in a time division manner within one horizontal scan period. In addition, display cells 154 serving as respective pixels are formed at the intersection parts between the respective gate lines GL1 to GLr and the respective data lines DL1 to DLm.

In addition, scan drivers 110_1 and 110_2 and multiplexers MX1 to MXk (k being an integer of 2 or more) are disposed on the display panel 150.

The scan driver 110_1 is connected with one end of each of the gate lines GL1 to GLr and the scan driver 110_2 is connected to the other end of each of the gate lines GL1 to GLr. The scan driver 110_1 generates a gate selection signal at a timing indicated by a gate line timing signal group GS supplied from the data driver 120, and sequentially supplies the gate selection signal to the end of each of the gate lines GL1 to GLr in order. The scan driver 110_2 generates a gate selection signal at a timing indicated by the gate line timing signal group GS supplied from the data driver 120, and sequentially supplies the gate selection signal to the other end of each of the gate lines GL1 to GLr.

Each of the multiplexers MX1 to MXk includes one input end, three output ends, and switches SW1 to SW3. The input ends individually receive gradation voltage signals Ds1 to Dsk corresponding to the respective pixels from the data driver 120. The three output ends are connected with three data lines of the same group among the data lines DL1 to DLm. The switches SW1 to SW3 individually connect or disconnect the input end and the respective three output ends. The switches SW1 to SW3 are sequentially and selectively set to be ON according to data line selection signals Sa, Sb, Sc supplied from the data driver 120.

The data driver 120 includes a drive control part 200, a power voltage generation part 90, a gradation voltage output part 125, and output buffer circuits BU1 and BU2. The data driver 120 is formed by a single semiconductor chip or multiple semiconductor chips, for example, and receives a video data signal VDS and various control signals from the outside. The output buffer circuits BU1 and BU2 are each formed by the output buffer circuit 500 shown in FIG. 7.

By exerting a predetermined signal process (description thereof is omitted) on the video data signal VDS, the drive control part 200 obtains a series of video data pieces representing the brightness levels of the respective pixels and supplies the series of video data pieces to the gradation voltage output part 125. In addition, the drive control part 200 supplies, to the output buffer circuits BU1 and BU2, a control signal group that serves as the basis of first to third data line switching signals and gate line timing signals. The first to third data line switching signals sequentially and selectively set the switches SW1 to SW3 of each of the multiplexers MX1 to MXk to be ON based on the various signals, and the gate line timing signals indicate the timings of selecting the gate lines. In addition, the drive control part 200 supplies the timing control signal Cs1 and the setting signal Cs2 to the respective bias parts of the output buffer circuits BU1 and BU2.

The power voltage generation part 90 receives an external power voltage, generates an internal power voltage operating various module operations based on the external power voltage, and supplies the internal power voltage to the drive control part 200, the gradation voltage output part 125, and the output buffer circuits BU1 and BU2.

The gradation voltage output part 125 generates the gradation voltage signals Ds1 to Dsk having the voltage values corresponding to the brightness levels of the respective pixels indicated by the series of video data supplied from the drive control part 200, and supplies the gradation voltage signals Ds1 to Dsk to the respective input ends of the multiplexers MX1 to MXk, respectively.

Each of the output buffer circuits BU1 and BU2 includes multiple buffer parts 10_1 to 10M and a single bias part 30 as shown in FIG. 7. The control of the drive control part 20A shown in FIG. 7 is exerted by the drive control part 200 of FIG. 8.

Each of the output buffer circuits BU1 and BU2 receives, as the input signals Si_1 to Si_3, the control signal group serving as the basis of the first to third data line switching signals supplied from the drive control part 200, and receives, as the input signals Si_4 to Si_M, the control signal group serving as the basis of the gate timing signals.

Then, each of the output buffer circuits BU1 and BU2 supplies, as the data line selection signals Sa to Sc, the output signals So_1 to So_3 output in accordance with the input signals Si_1 to Si_3 to each of the multiplexers MX1 to MXk.

In addition, the output buffer circuit BU1 supplies, as the gate line timing signal group GS, the output signals So_4 to So_M output in accordance with the input signals Si_4 to Si_M to the scan driver 110_1. Likewise, the output buffer circuit BU2 supplies, as the gate line timing signal group GS, the output signals So_4 to So_M output in accordance with the input signals Si_4 to Si_M to the scan driver 110_2.

In FIG. 8, as the display device 600, a configuration applied to the following is shown: the data lines DL1 to DLm of the display panel 150 are grouped into groups of three, and three data lines are driven in the time division manner within one horizontal scan period for each group. However, the number of data lines for time division driving within one horizontal scan period is not limited to three.

In brief, as the display device 600, it suffices as long as the device includes a display panel and a data driver, the display panel including: $1^{st}$ to $m^{th}$ data lines (DL1 to DLM), m being an integer equal to or more than 2, and multiple gate lines (GL1 to GLr), the $1^{st}$ to $m^{th}$ data lines stretching along the horizontal direction of the display frame, and the gate lines stretching along the vertical direction of the display frame; and a scan driver as follows.

That is, the scan driver (110_1, 110_2) receives the gate line timing signal (GS) and supplies the gate selection signal to each of multiple gate lines (GL1 to GLr) at the timing in accordance with the gate line timing signal.

(m/j) multiplexers (MX1 to MXk) are further disposed in the display panel (150). The multiplexer is provided for every j (j being an integer equal to or greater than 2) of the first to $m^{th}$ data lines, and each has one input end and sequentially and selectively connects the j data lines to the one input end in accordance with the data line selection signal (Sa to Sc).

The data driver (120) receives the video data signal (VDS), generates (m/j) gradation voltage signals (Ds1 to Dsk) having voltage values corresponding to the brightness levels of the respective pixels based on the video data signal, and supplies the respective (m/j) gradation voltage signals (Ds1 to Dsk) to the input terminals of the respective (m/j) multiplexers. It is noted that the data driver includes the output buffer circuit (FIGS. 1, 6, 7), and supplies the gate timing signals or the data line selection signals to the display panel as the output signals of the output buffer circuits.

Figure 9:
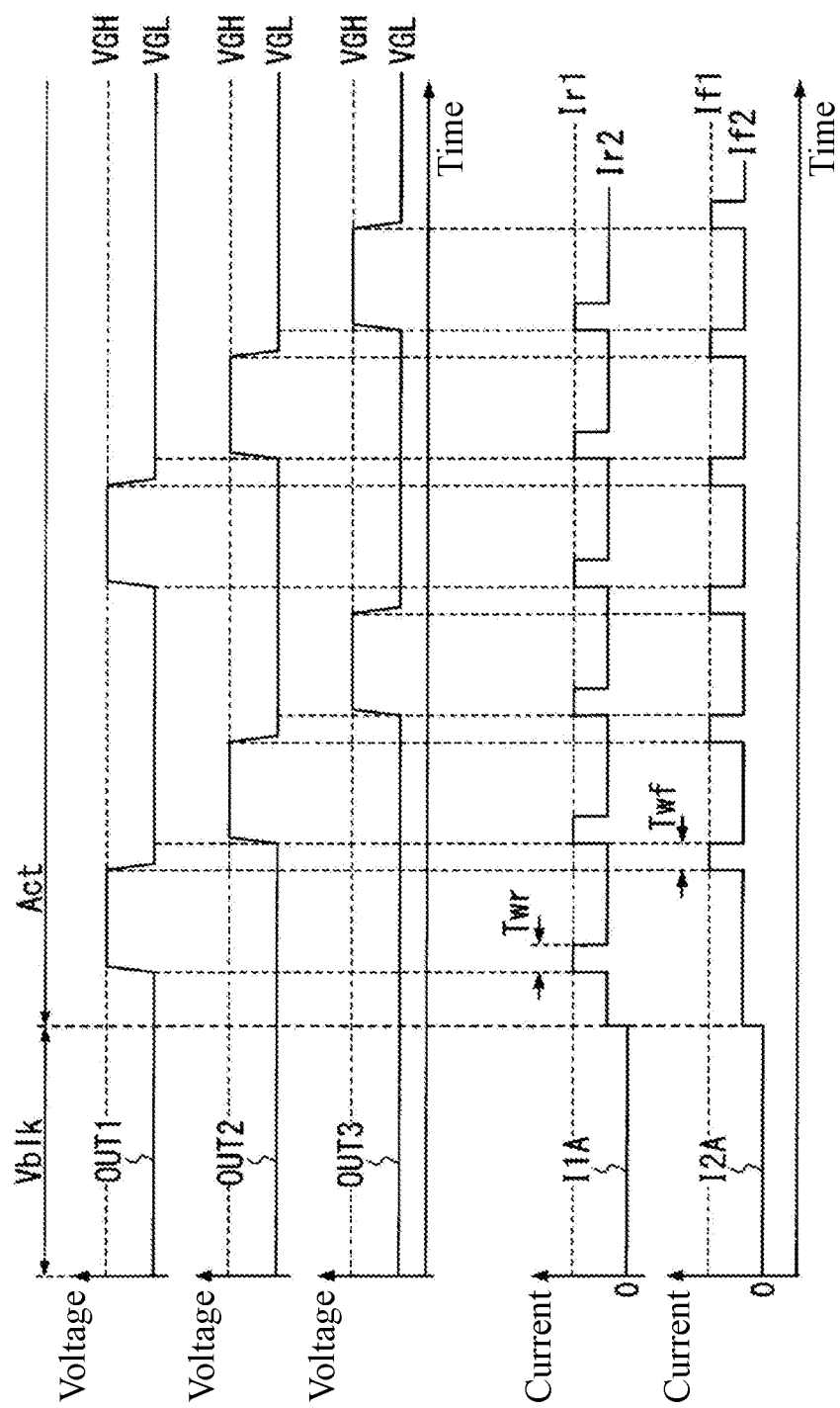
FIG. 9 is a time chart illustrating a control operation of a bias current and data switching signals OUT1 to OUT3 output from output buffers BU1 and BU2 of the display device 600.

FIG. 9 is a time chart extracting, as the output signals OUT1 to OUT3, the first to third data line switching signals sequentially and selectively setting the switches SW1 to SW3 of each of the multiplexers MX1 to MXk from various signals (Sa to Sc, GS) output from the output buffer circuits BU1 and BU2 of the display device 600 and illustrating the control operation of the bias currents.

As shown in FIG. 9, in a vertical blank period Vblk in the video data signal VDS, the variable current sources 41 and 42 of the bias part 30 set the current values of the bias currents I1A and I2A to zero, thereby stopping the operation of the bias part 30. In addition, in the vertical blank period Vblk, as shown in FIG. 9, the data line switching signals OUT1 to OUT3 become a power voltage VGL fixed state.

Meanwhile, in a display period Act in the video data signal VDS, the bias current I1A flows to input side of the first current mirror circuit (35, 15). At each time point when the voltage of each of the data line switching signals OUT1 to OUT3 rises, the bias current I1A has the current value Ir1 throughout the predetermined period Twr from such time point and has the current value Ir2 lower than the current value Ir1 in other periods. In addition, in the display period Act, the bias current I2A flows to the input side of the second current mirror circuit (36, 16). At each time point when the voltage of each of the data line switching signals OUT1 to OUT3 drops, the bias current I2A has the current value If1 throughout the predetermined period Tfr from such time point and has the current value If2 lower than the current value If1 in other periods.

In this way, in the vertical blank period Vblk, the output buffer circuits BU1 and BU2 set the bias current I1A (I2A) setting the current values of the bias currents I1B and I2B to zero.

In addition, within the display period Act, the output buffer circuits BU1 and BU2 set the bias current I1A (I2A) to the desired current value Ir1 (If1) only during the predetermined period Twr (Twf) when the voltage of each of the data line switching signals OUT to OUT3 changes, and switch the bias current I1A (I2A) to the current value Ir2 (If2) lower than the current value Ir1 (If1) in other periods.

Accordingly, the average consumed current consumed by the bias part 30 of each of the output buffer circuits BU1 and BU2 is reduced, and the power consumption is reduced.

An example in which the output buffer circuit (FIGS. 1, 6, 7) is provided in the data driver 120 shown in FIG. 9 and the high-voltage binary control signal is supplied to the scan drivers or the multiplexers of the display panel 150 is described above. However, in the case where the output buffer circuit is formed by a semiconductor device different from the data driver, etc., the output buffer circuit of FIGS. 1, 6, 7 can also be applied for a configuration of supplying the high-voltage binary control signal from the semiconductor device other than the data driver to a thin film transistor circuit in a display panel. In such case, the semiconductor device in which the output buffer circuit is mounted can suppress the occurrence of EMI, and can reduce power consumption and circuit area.

What is claimed is:

1. An output buffer circuit for outputting an output signal in which a binary input signal is amplified from an output terminal, the output buffer circuit comprising:
a bias part, generating a bias current; and
a buffer part, generating a mirror current of the bias current, receiving the input terminal, and generating the output signal,
wherein the buffer part has:
a first transistor of a first conductivity type, supplying a first power voltage to the output terminal in a case of becoming an ON state in accordance with a voltage of the input signal received by a gate of the first transistor;
a second transistor of a second conductivity type, supplying a second power voltage to the output terminal in a case of becoming the ON state in accordance with the voltage of the input signal received by a gate of the second transistor, the second power voltage being lower than the first power voltage; and
an output control part, transitioning a transistor in an OFF state between the first transistor and the second transistor to the ON state by changing a voltage of the gate of the transistor in the OFF state at a change speed based on a current value of the mirror current when the voltage of the input signal changes,
wherein, in accordance with a voltage change of the input signal, the bias part sets a current value of the bias current to a first current value throughout a predetermined period, and switches the current value of the bias current to a second current value smaller than the first current value in periods other than the predetermined period.

2. The output buffer circuit as claimed in claim 1, wherein, when the voltage of the input signal changes, the output control part transitions a transistor in the ON state between the first transistor and the second transistor to the OFF state by changing the voltage of the gate of the transistor in the ON state at a change speed in accordance with the voltage change of the input signal.

3. The output buffer circuit as claimed in claim 2, further comprising: a drive control part, generating a timing control signal and a setting signal, and supplying the timing control signal and the setting signal to the bias part, the timing control signal indicating, as the predetermined period, a period including a portion or entirety of a change period in which the voltage of the gate of the transistor in the OFF state changes when the voltage of the input signal changes, and the setting signal indicating the first current value and the second current value,
wherein the bias part, in accordance with the voltage change of the input signal, sets the current value of the bias current to the first current value indicated by the setting signal throughout the predetermined period indicated by the timing control signal, and sets the current value of the bias current to the second current value indicated by the setting signal in the periods other than the predetermined period.

4. The output buffer circuit as claimed in claim 1, further comprising: a drive control part, generating a timing control signal and a setting signal, and supplying the timing control signal and the setting signal to the bias part, the timing control signal indicating, as the predetermined period, a period including a portion or entirety of a change period in which the voltage of the gate of the transistor in the OFF state changes when the voltage of the input signal changes, and the setting signal indicating the first current value and the second current value,
wherein the bias part, in accordance with the voltage change of the input signal, sets the current value of the bias current to the first current value indicated by the setting signal throughout the predetermined period indicated by the timing control signal, and sets the current value of the bias current to the second current value indicated by the setting signal in the periods other than the predetermined period.

5. The output buffer circuit as claimed in claim 4, wherein the timing control signal and the setting signal are arranged as a common control signal, and are arranged as a control signal that controls the current value of the bias current to be set to indicate the first current value in the predetermined period and control the current value of the bias current to be set to indicate the second current value in the periods other than the predetermined period.

6. The output buffer circuit as claimed in claim 5, wherein the drive control part decreases a period length of the predetermined period as the first current value increases.

7. The output buffer circuit as claimed in claim 4, wherein the drive control part decreases a period length of the predetermined period as the first current value increases.

8. The output buffer circuit as claimed in claim 1, wherein the buffer part generates, as the mirror current, a first mirror current and a second mirror current, the first mirror current having a current value generating an effect of changing the voltage of the gate to the ON state, the second mirror current having a current value generating an effect of changing the voltage of the gate of the second transistor to the ON state, and
the bias part generates, as the bias current, a first bias current serving as a basis of the first mirror current and a second bias current serving as a basis of the second mirror current.

9. An output buffer circuit for outputting $1^{st}$ to $M^{th}$ output signals in which binary $1^{st}$ to $M^{th}$ input signals are respectively amplified from $1^{st}$ to $M^{th}$ output terminals, M being an integer equal to or greater than 2, and the output buffer circuit comprising:
a bias part, generating a bias current; and
$1^{st}$ to $M^{th}$ buffer parts, individually receiving the $1^{st}$ to $M^{th}$ input signals, individually generating mirror currents of the bias current, and individually connected with one corresponding output terminal of the $1^{st}$ to $M^{th}$ output signals,
wherein each of the $1^{st}$ to $M^{th}$ buffer parts has:
a first transistor of a first conductivity type, receiving the input signal received by its own by using a gate, and supplying a first power voltage to the one output terminal in a case of becoming an ON state in accordance with a voltage of the input signal; a second transistor of a second conductivity type, receiving the input signal received by its own by using a gate, and supplying a second power voltage lower than the first power voltage to the one output terminal in a case of becoming the ON state in accordance with the voltage of the input signal; and an output control part, transitioning a transistor in an OFF state between the first transistor and the second transistor to the ON state by changing a voltage of the gate of the transistor in the OFF state at a change speed based on a current value of the mirror current when the voltage of the input signal changes,
wherein, in accordance with a voltage change of each of the $1^{st}$ to $M^{th}$ input signals, the bias part sets a current value of the bias current to a first current value throughout a predetermined period, and switches the current value of the bias current to a second current value smaller than the first current value in periods other than the predetermined period.

10. The output buffer circuit as claimed in claim 9, wherein, when the voltage of the input signal changes, the output control part of each of the $1^{st}$ to $M^{th}$ buffer parts transitions a transistor in the ON state between the first transistor and the second transistor to the OFF state by changing the voltage of the gate of the transistor in the ON state at a change speed in accordance with the voltage change of the input signal received by the transistor.

11. A data driver, driving, in accordance with a video data signal, a display panel disposed with:
   $1^{st}$ to $m^{th}$ data lines, m being an integer equal to or more than 2, and a plurality of gate lines, wherein the $1^{st}$ to $m^{th}$ data lines stretch along a horizontal direction of a display frame, and the gate lines stretch along a vertical direction of the display frame;
   a scan driver, receiving a gate timing signal and supplying a gate selection signal at a timing in accordance with the gate timing signal to each of the gate lines; and
   (m/j) multiplexers, provided for every j of the $1^{st}$ to $m^{th}$ data lines, j being an integer equal to or greater than 2, wherein each of the multiplexers has one input end, and the (m/j) multiplexers selectively and sequentially connect each of the j data lines to the input end in accordance with a data line selection signal, the data driver comprising:
   a gradation voltage output part, generating (m/j) gradation voltage signals having voltage values corresponding to brightness levels of respective pixels based on the video data signal, and supplying the respective (m/j) gradation voltage signals to the input ends of the respective (m/j) multiplexers; and
   the output buffer circuit as claimed in claim 9, wherein the data driver supplies the gate timing signal or the data line selection signal, as the output signal of the output buffer circuit, to the display panel.

12. A display device, having: a display panel, the display panel is disposed with:
   $1^{st}$ to $m^{th}$ data lines, m being an integer equal to or more than 2, and a plurality of gate lines, wherein the $1^{st}$ to $m^{th}$ data lines stretch along a horizontal direction of a display frame, and the gate lines stretch along a vertical direction of the display frame; a scan driver, receiving a gate timing signal and supplying a gate selection signal at a timing in accordance with the gate timing signal to each of the gate lines; and (m/j) multiplexers, provided for every j of the $1^{st}$ to $m^{th}$ data lines, j being an integer equal to or greater than 2, wherein each of the multiplexers has one input end, and the (m/j) multiplexers selectively and sequentially connect each of the j data lines to the input ends in accordance with a data line selection signal; and
   a data driver, receiving a video data signal and generating (m/j) gradation voltage signals having voltage values corresponding to brightness levels of respective pixels based on the video data signal, and supplying the respective (m/j) gradation voltage signals to the input ends of the respective (m/j) multiplexers,
   wherein the data driver comprises the output buffer circuit as claimed in claim 11, and supplies the gate timing signal or the data line selection signal, as the output signal of the output buffer circuit, to the display panel.

13. A semiconductor device, driving a display panel disposed with: a plurality of data lines and a plurality of gate lines, wherein the data lines stretch along a horizontal direction of a display frame, and the gate lines stretch along a vertical direction of the display frame; a display device, disposed at an intersection part of each of the data lines and each of the gate lines; and a thin film transistor, controlling driving of a display frame by using the display device,
   wherein the semiconductor device comprises the output buffer circuit as claimed in claim 9, and supplies the $1^{st}$ to $M^{th}$ output signals of the output buffer circuit to the display panel in accordance with a predetermined driving timing signal.

* * * * *